United States Patent
Meyer et al.

(10) Patent No.: US 9,263,376 B2
(45) Date of Patent: Feb. 16, 2016

(54) CHIP INTERPOSER, SEMICONDUCTOR DEVICE, AND METHOD FOR MANUFACTURING A SEMICONDUCTOR DEVICE

(71) Applicant: Intel Mobile Communications GmbH, Neubiberg (DE)

(72) Inventors: Thorsten Meyer, Regensburg (DE); Gerald Ofner, Regensburg (DE)

(73) Assignee: INTEL DEUTSCHLAND GMBH, Neubiberg (DE)

( * ) Notice: Subject to any disclaimer, the term of this patent is extended or adjusted under 35 U.S.C. 154(b) by 0 days.

(21) Appl. No.: 13/862,524

(22) Filed: Apr. 15, 2013

(65) Prior Publication Data

US 2014/0306355 A1    Oct. 16, 2014

(51) Int. Cl.
*H01L 23/48* (2006.01)
*H01L 23/498* (2006.01)
*H01L 23/00* (2006.01)

(52) U.S. Cl.
CPC .............. *H01L 23/498* (2013.01); *H01L 24/11* (2013.01); *H01L 24/14* (2013.01); *H01L 24/17* (2013.01); *H01L 24/81* (2013.01); *H01L 24/03* (2013.01); *H01L 24/05* (2013.01); *H01L 24/13* (2013.01); *H01L 24/16* (2013.01); *H01L 24/29* (2013.01); *H01L 2224/0345* (2013.01); *H01L 2224/0401* (2013.01); *H01L 2224/05166* (2013.01); *H01L 2224/05171* (2013.01); *H01L 2224/05567* (2013.01); *H01L 2224/05624* (2013.01); *H01L 2224/05644* (2013.01); *H01L 2224/05647* (2013.01); *H01L 2224/05655* (2013.01); *H01L 2224/05664* (2013.01); *H01L 2224/05666* (2013.01); *H01L 2224/05671* (2013.01); *H01L 2224/05684* (2013.01); *H01L 2224/10175* (2013.01); *H01L 2224/1132* (2013.01); *H01L 2224/1146* (2013.01); *H01L 2224/1147* (2013.01); *H01L 2224/11462* (2013.01); *H01L 2224/11464* (2013.01); *H01L 2224/11474* (2013.01); *H01L 2224/11849* (2013.01); *H01L 2224/11903* (2013.01); *H01L 2224/131* (2013.01); *H01L 2224/136* (2013.01); *H01L 2224/13022* (2013.01); *H01L 2224/13111* (2013.01); *H01L 2224/13116* (2013.01); *H01L 2224/13124* (2013.01); *H01L 2224/13144* (2013.01); *H01L 2224/13147* (2013.01); *H01L 2224/13155* (2013.01);

(Continued)

(58) Field of Classification Search
CPC ............ H01L 23/3128; H01L 23/4824; H01L 23/49827; H01L 23/5226; H01L 23/49816; H01L 23/5383; H01L 23/49822; H01L 23/5384; H01L 21/4857; H01L 21/486; H01L 21/4846; H01L 23/498; H01L 24/11; H01L 24/14; H01L 24/17; H01L 24/81; H01L 2224/97; H01L 2224/81; H01L 2225/06513; H01L 2224/12105
USPC .......... 257/668, 774, 778, E23.001, E23.011, 257/E23.02, E23.021, E23.067, E23.069; 438/108, 612, 613
See application file for complete search history.

(56) References Cited

U.S. PATENT DOCUMENTS 4,622,058 A * 11/1986 Leary-Renick et al. ........ 65/105
5,858,254 A * 1/1999 Balzer et al. ..................... 216/2

(Continued)

*Primary Examiner* — Khiem D Nguyen
(74) *Attorney, Agent, or Firm* — Viering, Jentschura & Partner MBB

(57) ABSTRACT

A chip interposer may include: a first interconnect level including a first pad; and a second interconnect level including a second pad, wherein the second pad may face in the same direction as the first pad.

25 Claims, 16 Drawing Sheets

(52) U.S. Cl.
CPC ............... *H01L 2224/13164* (2013.01); *H01L 2224/13166* (2013.01); *H01L 2224/13171* (2013.01); *H01L 2224/13184* (2013.01); *H01L 2224/13561* (2013.01); *H01L 2224/1403* (2013.01); *H01L 2224/16225* (2013.01); *H01L 2224/16227* (2013.01); *H01L 2224/16237* (2013.01); *H01L 2224/16238* (2013.01); *H01L 2224/171* (2013.01); *H01L 2224/814* (2013.01); *H01L 2224/81193* (2013.01); *H01L 2224/81203* (2013.01); *H01L 2224/81385* (2013.01); *H01L 2224/81424* (2013.01); *H01L 2224/81444* (2013.01); *H01L 2224/81447* (2013.01); *H01L 2224/81455* (2013.01); *H01L 2224/81464* (2013.01); *H01L 2224/81466* (2013.01); *H01L 2224/81471* (2013.01); *H01L 2224/81484* (2013.01); *H01L 2224/81801* (2013.01); *H01L 2924/1461* (2013.01)

(56) References Cited

U.S. PATENT DOCUMENTS

| | | | |
|---|---|---|---|
| 6,429,113 B1 * | 8/2002 | Lewis et al. | 438/612 |
| 6,680,218 B2 * | 1/2004 | Chung et al. | 438/108 |
| 2002/0195272 A1 * | 12/2002 | Rokugawa et al. | 174/262 |
| 2003/0160325 A1 * | 8/2003 | Yoneda et al. | 257/758 |
| 2003/0173676 A1 * | 9/2003 | Horikawa | 257/758 |
| 2009/0126981 A1 * | 5/2009 | Horiuchi et al. | 174/262 |
| 2010/0147560 A1 * | 6/2010 | Kaneko | 174/250 |
| 2012/0056316 A1 * | 3/2012 | Pagaila et al. | 257/737 |

* cited by examiner

400

Provide chip interposer including first interconnect level including first pad, and second interconnect level including second pad, wherein second pad faces in the same direction as first pad — 408

Attach chip to chip interposer, wherein first pad of chip interposer is attached to first electrically conductive pillar and second pad of chip interposer is attached to second electrically conductive pillar — 410

FIG. 4 (Continued)

CHIP INTERPOSER, SEMICONDUCTOR DEVICE, AND METHOD FOR MANUFACTURING A SEMICONDUCTOR DEVICE

TECHNICAL FIELD

Various aspects relate to a chip interposer, a semiconductor device, and a method for manufacturing a semiconductor device.

BACKGROUND

With the advance of technology, the size (e.g. lateral extent) of chips (or dies) has decreased. Whilst the size (e.g. lateral extent) of a chip may have decreased, the number of interconnects that may, for example, couple (e.g. electrically couple) the chip to a circuit board (e.g. a printed circuit board) has remained stable, and in some examples, has increased. Accordingly, a distance between adjacent interconnects, which may also be referred to as a pitch of the interconnects, has decreased.

The plurality of interconnects that may, for example, couple (e.g. electrically couple) the chip to a circuit board (e.g. a printed circuit board) may be coupled to a plurality of pads that may be provided at a surface of the chip (or die). Consequently, a pitch of the plurality of pads of the chip (or die) has decreased as well. The decrease in the pitch of the plurality of pads of the chip may pose a challenge in packaging the chip (or die). New packaging solutions may be needed.

SUMMARY

A chip interposer is provided, which may include: a first interconnect level including a first pad; a second interconnect level including a second pad, wherein the second pad may face in the same direction as the first pad.

A semiconductor device is provided, which may include: a chip interposer, which may include: a first interconnect level including a first pad; a second interconnect level including a second pad, wherein the second pad may face in the same direction as the first pad; a chip disposed over the chip interposer, the chip including a first pad and a second pad, wherein the first pad of the chip may be electrically coupled to the first pad of the first interconnect level of the chip interposer, and wherein the second pad of the chip may be electrically coupled to the second pad of the second interconnect level of the chip interposer.

A method for manufacturing a semiconductor device may be provided, which may include: providing a chip including at least a first pad and a second pad; forming a first electrically conductive pillar over the first pad and forming a second electrically conductive pillar over the second pad, wherein the first electrically conductive pillar may include a first height and the second electrically conductive pillar may include a second height that is different from the first height.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

Figure 1A:
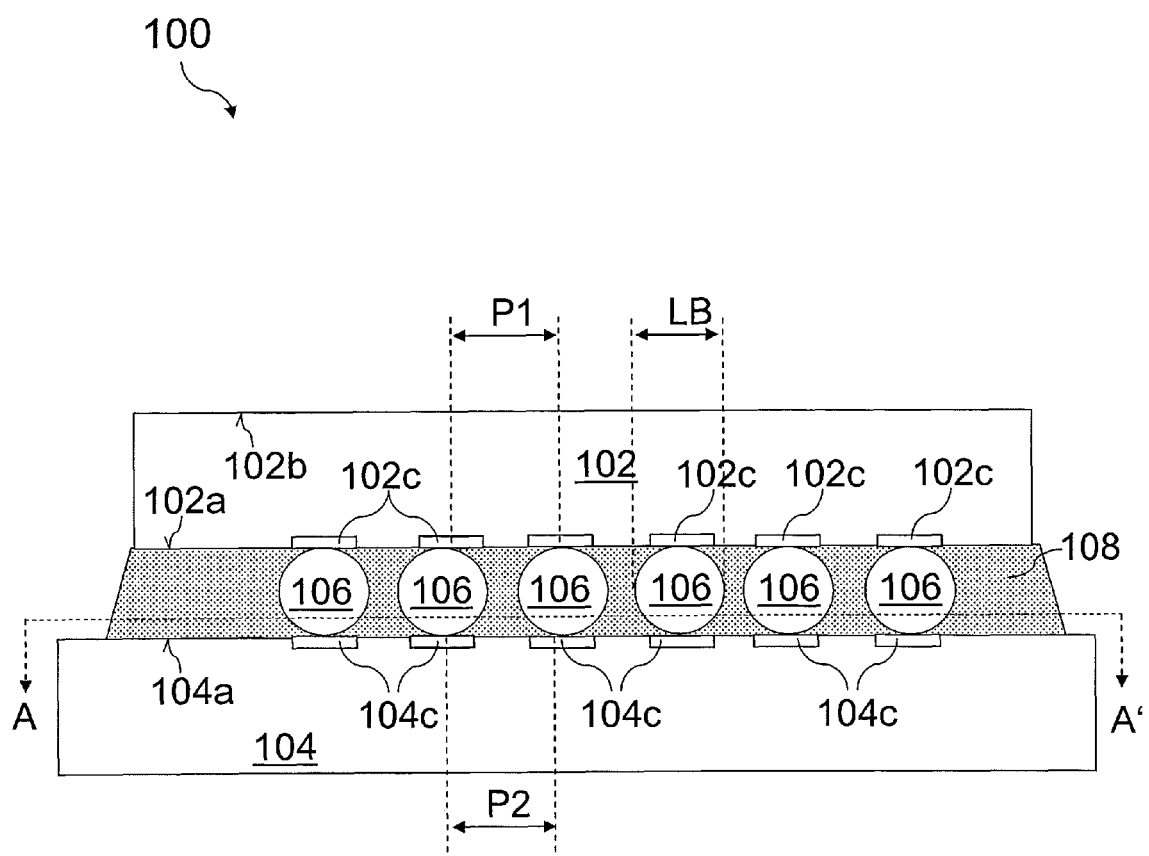
FIG. 1A shows a cross-sectional view of a chip package including a chip and a circuit board, which may be electrically coupled to each other by means of a plurality of interconnects.

The following detailed description refers to the accompanying drawings that show, by way of illustration, specific details and aspects in which the invention may be practised. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects can be combined with one or more other aspects to form new aspects. Various aspects are described for structures or devices, and various aspects are described for methods. It may be understood that one or more (e.g. all) aspects described in connection with structures or devices may be equally applicable to the methods, and vice versa.

The word "exemplary" is used herein to mean "serving as an example, instance, or illustration". Any aspect or design described herein as "exemplary" is not necessarily to be construed as preferred or advantageous over other aspects or designs.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

In like manner, the word "cover", used herein to describe a feature disposed over another, e.g. a layer "covering" a side or surface, may be used to mean that the feature, e.g. the layer, may be disposed over, and in direct contact with, the implied side or surface. The word "cover", used herein to describe a feature disposed over another, e.g. a layer "covering" a side or surface, may be used to mean that the feature, e.g. the layer, may be disposed over, and in indirect contact with, the implied side or surface with one or more additional layers being arranged between the implied side or surface and the covering layer.

The terms "coupled" and/or "electrically coupled" and/or "connected" and/or "electrically connected", used herein to describe a feature being connected to at least one other implied feature, are not meant to mean that the feature and the at least one other implied feature must be directly coupled or connected together; intervening features may be provided between the feature and at least one other implied feature.

Directional terminology, such as e.g. "upper", "lower", "top", "bottom", "left-hand", "right-hand", etc., may be used with reference to the orientation of figure(s) being described. Because components of the figure(s) may be positioned in a number of different orientations, the directional terminology is used for purposes of illustration and is in no way limiting. It is to be understood that structural or logical changes may be made without departing from the scope of the invention.

A chip (or die) may be used in one or more applications. For example, a chip (or die) may be used in micro-electromechanical systems (MEMS), logic, memory, power and communications applications, although other applications may be possible as well. With the advance of technology, the size (e.g. lateral extent) of chips (or dies) has decreased. Whilst the size (e.g. lateral extent) of a chip may have decreased, the number of interconnects that may, for example, couple (e.g. electrically couple) the chip to a circuit board (e.g. a printed circuit board) has remained stable, and in some examples, has increased. Accordingly, a distance between adjacent interconnects, which may also be referred to as a pitch of the interconnects, has decreased. The plurality of interconnects that may, for example, couple (e.g. electrically couple) the chip to a circuit board (e.g. a printed circuit board) may be coupled to a plurality of pads that may be provided at a surface of the chip (or die). Consequently, a pitch of the plurality of pads of the chip (or die) has decreased as well. The decrease in the pitch of the plurality of pads of the chip may pose a challenge in packaging the chip (or die). Accordingly, the tighter pitch of the plurality of pads of the chip may require new packaging solutions.

FIG. 1A shows a cross-sectional view of a chip package 100 including a chip 102 and a circuit board 104, which may be electrically coupled to each other by means of a plurality of interconnects 106.

The chip package 100 may, for example, be configured as a flip chip package. The chip 102 may include a first surface 102a (e.g. frontside or bottom surface or active side) and a second surface 102b (e.g. backside or top surface) opposite the first surface 102a. The chip 102 may include a plurality of pads 102c formed at, for example, the first surface 102a (e.g. frontside or bottom surface or active side). The plurality of pads 102c of the chip 102 may, for example, provide an interface (e.g. an electrical interface) for the chip 102. In other words, signals (e.g. electrical signals, power supply potentials, ground potentials, etc.) may be exchanged with the chip 102 via the plurality of pads 102c. Adjacent pads of the plurality of pads 102c of the chip 102 may be separated by a lateral distance P1, which may be a pitch P1 of the plurality of pads 102c of the chip 102.

The circuit board 104 may include a plurality of contacts 104c that may be formed at a surface 104a of the circuit board 104, which may face the chip 102. Adjacent pads of the plurality of pads 104c of the circuit board 104 may be separated by a lateral distance P2, which may be a pitch P2 of the plurality of pads 104c of the circuit board 104. In the chip package 100 shown in FIG. 1A, the pitch P1 of the plurality of pads 102c of the chip 102 may be at least substantially equal to the pitch P2 of the plurality of pads 104c of the circuit board 104.

The circuit board 104 may include, or may be, an interposer board. The circuit board 104 may include, or may be, a printed circuit board (PCB). The circuit board 104 may include at least one circuit and/or additional chip (or die) that may, for example, be connected (e.g. electrically connected) to the chip 102 via the plurality of interconnects 106.

The plurality of interconnects 106 may include, or may consist of, an electrically conductive material (e.g. a metal or metal alloy). The plurality of interconnects 106 may couple (e.g. electrically couple) the plurality of pads 102c of the chip 102 and the plurality of contacts 104c of the circuit board 104 to each other. Accordingly, the plurality of interconnects 106 may provide a means for the chip 102 and the circuit board 104 to exchange signals (e.g. electrical signals, power supply potentials, ground potentials, etc.) with each other.

The chip package 100 may include an underfill layer 108 that may be disposed between the chip 102 and the circuit board 104. The underfill layer 108 may at least partially enclose the plurality of interconnects 106. The underfill layer 108 may include, or may consist of, an insulating material, which may, for example, include at least one of an epoxy material, a polyurethane material and an epoxy blend including two or more epoxy materials. The underfill layer 108 may be filled with filler particles, such as silica filler, glass filler or similar fillers. In another example, the underfill layer 108 may not be filled with filler particles.

A shape and/or a material of the plurality of interconnects 106 may depend on the pitch P1 of the plurality of pads 102c of the chip 102 and/or pitch P2 of the plurality of pads 104c of the circuit board 104. For example, in case the pitch P1 and/or the pitch P2 is greater than or equal to about 150 µm (e.g. greater than or equal to about 180 µm), the plurality of interconnects 106 may include, or may be, standard bumps that may be coupled to the circuit board 104, which may be a standard substrate. For example, the standard bumps may include, or may be, solder bumps, for example, solder balls, as shown in FIG. 1A. In such an example, a soldering process may, for example, be used to couple (e.g. electrically couple) the plurality of interconnects 106 to the plurality of pads 102c of the chip 102 and the plurality of pads 104c of the circuit board 104.

During soldering, a lateral extent LB (e.g. a width, e.g. a diameter) of the plurality of interconnects 106 (e.g. solder bumps) may increase. Consequently, a material of the plurality of interconnects 106 (e.g. solder bumps) may spread on the first surface 102a of the chip 102 and/or the surface 104a of the circuit board. In an example where the pitch P1 of the plurality of pads 102c of the chip 102 and/or the pitch P2 of the plurality of pads 104c of the circuit board 104 is small (e.g. less than about 150 µm), adjacent interconnects of the plurality of interconnects 106 may come into contact (e.g. physical contact) with each other and may, consequently, cause an electrical short.

Pillar technology (e.g. metal or metal alloy pillar technology, e.g. copper pillar technology) may be used in case the pitch P1 of the plurality of pads 102c of the chip 102 and/or the pitch P2 of the plurality of pads 104c of the circuit board 104 is, for example, less than about 150 µm, e.g. in the range from about 100 µm to about 150 µm, e.g. in the range from about 120 µm to about 150 µm. For example, the plurality of interconnects 106 may include, or may be, a plurality of pillars (e.g. metal or metal alloy pillars, e.g. copper pillars).

Figure 1B:
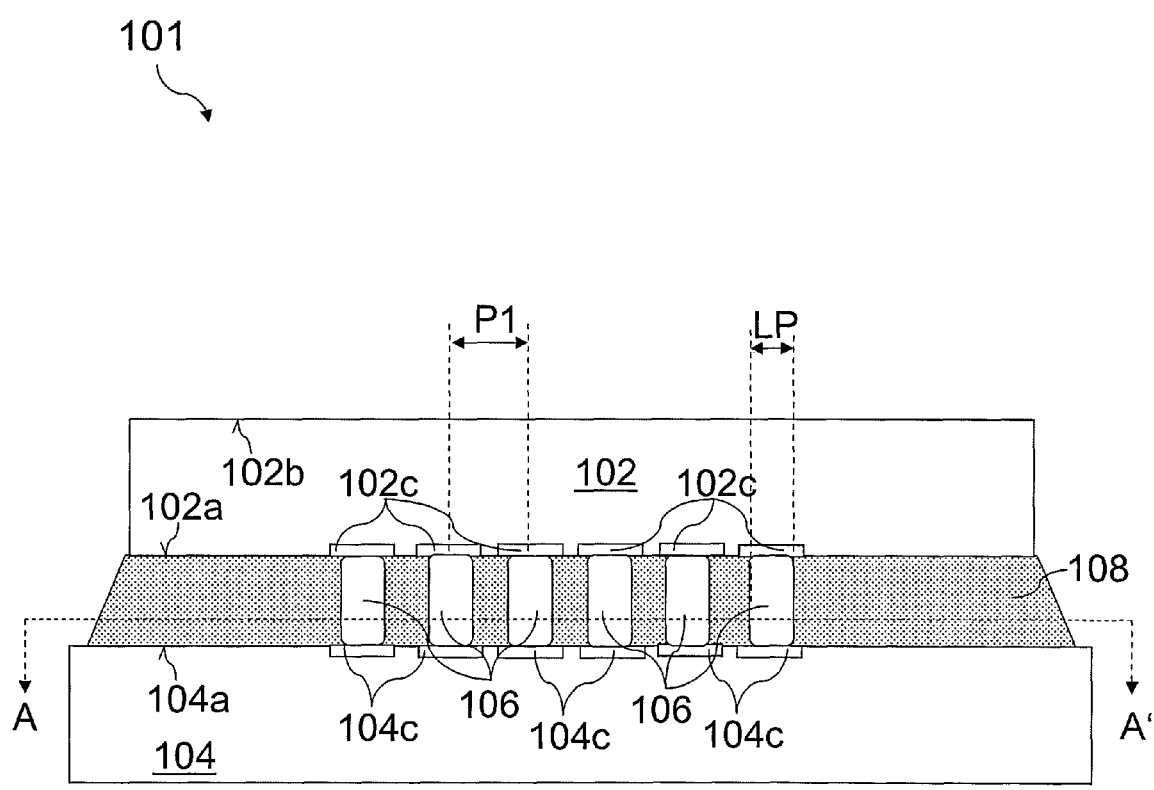
FIG. 1B shows a cross-sectional view of a chip package including a chip, a circuit board, and a plurality of interconnects configured as a plurality of pillars.

FIG. 1B shows a cross-sectional view of a chip package 101 including the chip 102, the circuit board 104, and the plurality of interconnects 106 configured as a plurality of pillars.

A lateral extent LP (e.g. width, e.g. diameter) of the plurality of interconnects 106 configured as a plurality of pillars (shown in FIG. 1B) may be smaller than the lateral extent LB of the plurality of interconnects 106 configured as a plurality of solder balls (shown in FIG. 1A). The smaller lateral extent LP of the plurality of interconnects 106 configured as a plurality of pillars (shown in FIG. 1B) may allow adjacent interconnects of the plurality of interconnects 106 (shown in FIG. 1B) to be placed closer together without having the adjacent interconnects coming into contact (e.g. physical contact) with each other and without causing an electrical short. Accordingly, the plurality of interconnects 106 configured as a plurality of pillars (e.g. metal or metal alloy pillars, e.g. copper pillars) may be used in case the pitch P1 of the plurality of pads 102c of the chip 102 is less than about 150 µm (e.g. in the range from about 100 µm to about 150 µm, e.g. in the range from about 120 µm to about 150 µm).

In case the pitch P1 of the plurality of pads 102c is, for example, less than about 120 µm (e.g. less than or equal to about 100 µm) the plurality of interconnects 106 may, for example, be configured as a plurality of micro-bumps and/or micro-pillars. For example, the lateral extent LP (e.g. width, e.g. diameter) of an interconnect of the plurality of interconnects 106 may be in the order of a few microns to about a few tens of microns (e.g. less than or equal to about 50 µm, e.g. less than or equal to about 40 µm, e.g. less than or equal to about 20 µm). By way of another example, the lateral extent LP (e.g. width, e.g. diameter) of an interconnect of the plurality of interconnects 106 may be in the range from about 20 µm to about 50 µm. In such an example, a thermo-compression bonding process and/or an interposer (e.g. a 2.5 D interposer) may be used to couple (e.g. electrically couple) the plurality of interconnects 106 to the chip 102 and/or the circuit board 104.

Figure 1C:
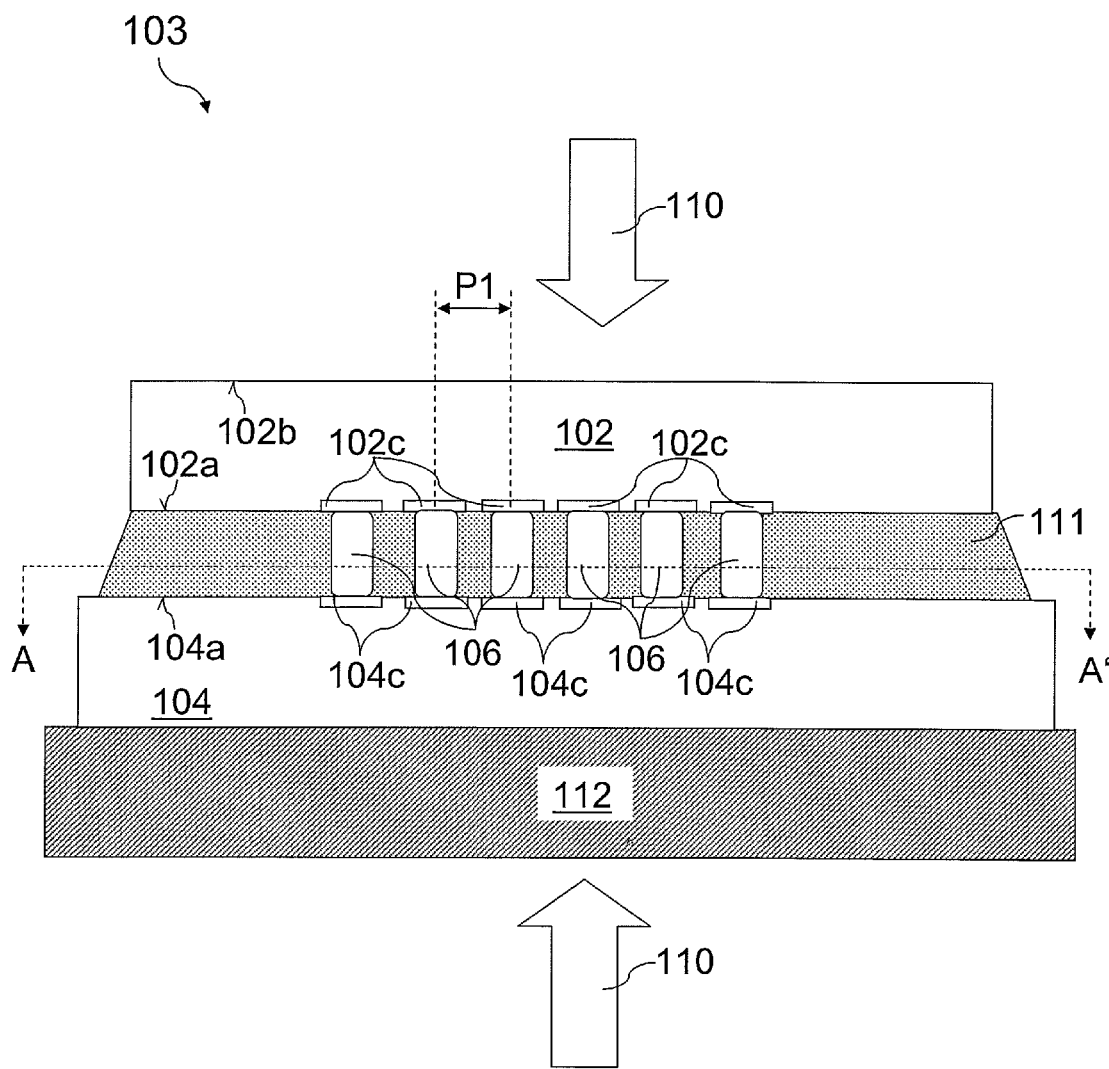
FIG. 1C shows a cross-sectional view of a chip package including a chip, a circuit board, and a thermo-compression bonding process that may couple the chip and the circuit board to each other via the plurality of interconnects.

FIG. 1C shows a cross-sectional view of a chip package 103 including the chip 102, the circuit board 104, and a thermo-compression bonding process (indicated by arrows 110) that may couple the chip 102 and the circuit board 104 to each other via the plurality of interconnects 106.

In the chip package 103 shown in FIG. 1C, the plurality of interconnects 106 may be configured as micro-pillars (e.g. metal or metal alloy micro-pillars, e.g. copper micro-pillars). In another example, the plurality of interconnects 106 may be configured as micro-bumps (e.g. metal or metal alloy micro-bumps, e.g. copper micro-bumps). A micro-pillar and/or a micro-bump may, for example, have a size (e.g. diameter) of less than or equal to about 40 µm, for example in the range from about 10 µm to about 40 µm, for example about 20 µm.

In order to create the thermo-compression bond between the chip 102 and the circuit board 104, an adhesive 111 (e.g. a glue) may be applied to the circuit board 104, and the chip 102 may be placed over or into the adhesive 111 (e.g. glue) such that the plurality of interconnects 106 may be in contact (e.g. physical contact) with the plurality of contacts 104c of the circuit board 104. The chip 102 and the circuit board 104 may be heated (e.g. by means of a heating plate 112), for example, to a temperature of about 300° C. The heating process may, for example, additionally cure the adhesive 111 (e.g. glue). The heated chip 102 and the heated circuit board 104 may be pressed together with a pre-determined force (indicated by arrows 110). The thermo-compression bonding between the chip 102 and the circuit board 104, which may be provided by the plurality of interconnects 106, may build up by means of at least one of soldering, diffusion bonding, pressure joining, thermocompression welding, and solid-state welding, although other bonding or joining processes may be possible as well.

Whilst the cost of using the adhesive 111 (e.g. glue) in the thermo-compression bonding process may be less than the cost of forming the underfill layer 108, a cost of the circuit board 104 (e.g. a cost of a material included in the circuit board 104) that may be used in the thermo-compression bonding process may be high. For example, the cost of the circuit board 104 may be at least twice the cost of a circuit board 104 used in the chip package 100 and/or the chip package 101 that may not require a thermo-compression bonding process to bond the chip 102 and the circuit board 104 to each other. By way of another example, the cost of the circuit board 104 used in a thermo-compression bonding process may contribute to about 70% of the cost of packaging the chip 102. Accordingly, the circuit board 104 may be a high-cost adder.

Routing (e.g. electrical routing) may need to be provided on the circuit board 104. The routing (e.g. electrical routing) may run between adjacent pads of the plurality of pads 102c of the chip 102. In the chip package 103 shown in FIG. 1C, the pitch P1 of the plurality of pads 102c of the chip 102 may be less than about 120 µm. In other words, the plurality of pads 102c of the chip 102 may have a fine-pitch. Consequently, fine-pitch routing may need to be provided on the circuit board 104.

The provision of fine-pitch routing in or over the circuit board 104 may contribute to the high cost of the circuit board 104 used in a thereto-compression bonding process.

A process time for the thermo-compression bonding process may be long (e.g. greater than or equal to about 3 seconds). The long process time (e.g. greater than or equal to about 3 seconds) may be a consequence of the heating process that may need to be performed (e.g. by means of the heating plate 112) on every chip 102 of every chip package 103 manufactured using the thermo-compression bonding process.

The thermo-compression bonding process may require a use of a high-precision bonder, for example, to ensure precise placement of the chip 102 on the circuit board 104, or vice versa. Use of the high-precision bonder may increase the cost of the thermo-compression bonding process.

As described above, an interposer (e.g. a 2.5 D interposer) may be used to couple (e.g. electrically couple) the plurality of interconnects 106 to the chip 102 and/or the circuit board 104 in case the pitch P1 of the plurality of pads 102c of the chip is small (e.g. less than about 120 µm).

Figure 1D:
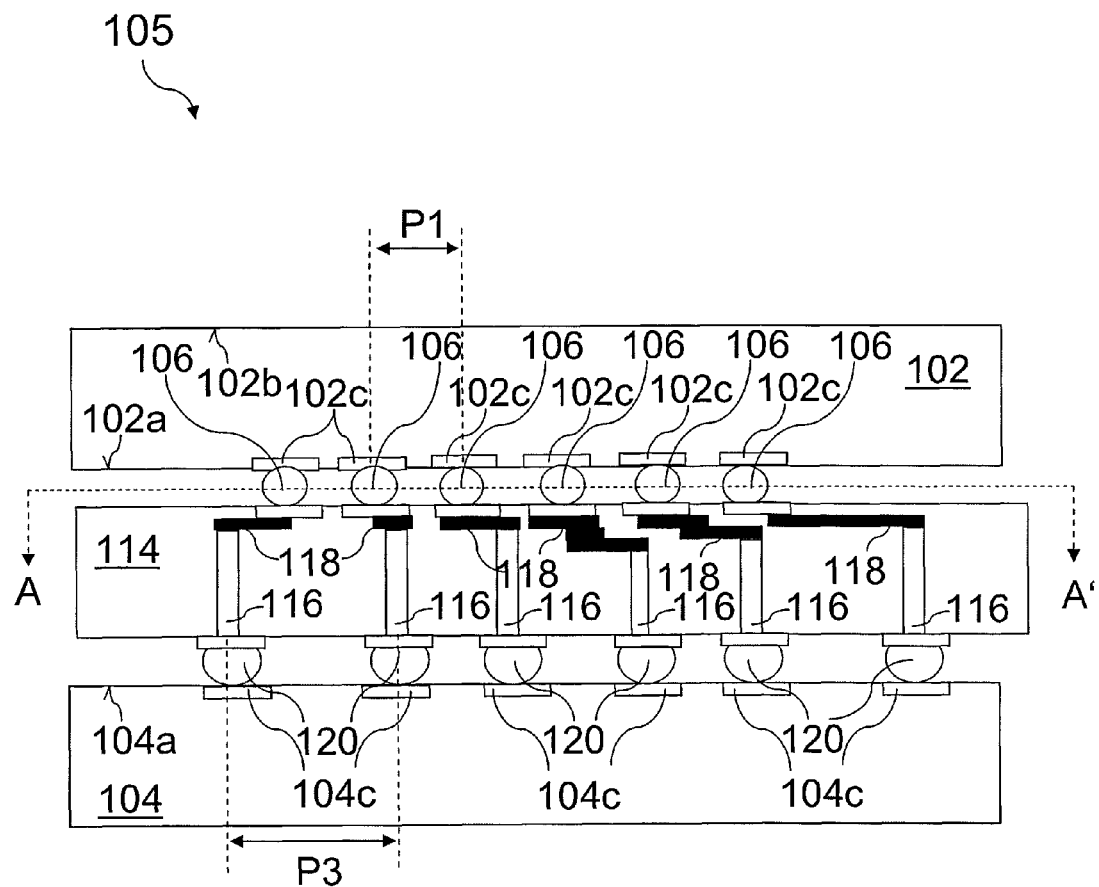
FIG. 1D shows a cross-sectional view of a chip package including a chip, a circuit board, and an interposer disposed between the chip and the circuit board.

FIG. 1D shows a cross-sectional view of a chip package 105 including the chip 102, the circuit board 104, and an interposer 114 disposed between the chip 102 and the circuit board 104.

The interposer 114 may include, or may consist of, a semiconductor material. The semiconductor material may include, or may be, at least one material selected from a group of materials, the group consisting of: silicon, germanium, gallium nitride, gallium arsenide, and silicon carbide, although other materials may be possible as well.

The interposer 114 may include a plurality of through-vias 116 and a plurality of electrically conductive lines 118. In an example where the interposer 114 includes, or consists of, silicon, the plurality of through-vias 116 may include, or may be, through-silicon vias (TSVs).

The chip 102 and the interposer 114 may be coupled (e.g. electrically coupled) to each other via the plurality of interconnects 106. The circuit board 104 and the interposer 114 may be coupled (e.g. electrically coupled) to each other via a plurality of interconnects 120. A pitch P3 of the plurality of pads 104c of the circuit board 104 may be larger than a pitch P1 of the plurality of pads 102c of the chip 102.

As shown in FIG. 1D, the interposer 114 (e.g. silicon interposer) may function as a transition element that may redistribute and/or re-map electrical connections from the plurality of pads 102c (e.g. having a pitch P1 of less than about 120 µm) to the circuit board 104. For example, the interposer 114 may re-map electrical connections from the plurality of pads 102c of the chip 102 having a fine pitch P1 (e.g. less than about 120 µm) to the plurality of pads 104c of the circuit board 104 having a pitch P3, which may be greater than the pitch P1 of the plurality of pads 102c of the chip 102 (e.g. greater than or equal to about 120 µm). In other words, the interposer 114 may re-map electrical connections from a fine pitch P1 to a relaxed pitch P3.

As shown in FIG. 1D, the chip package 105 may include the plurality of interconnects 106 which may couple (e.g. electrically couple) the chip 102 and the interposer 114 to each other, and the plurality of interconnects 120 which may couple (e.g. electrically couple) the interposer 114 and the circuit board 104 to each other. In other words, the chip package 105 may include two sets of flip-chip interconnects (e.g. the plurality of interconnects 106 and the plurality of interconnects 120).

A cost of the chip package 105 may be high. The interposer 114 may be expensive, and this may contribute to the high cost of the chip package 105. By way of another example, forming the two sets of flip-chip interconnects (e.g. the plurality of interconnects 106 and the plurality of interconnects 120) may be expensive, and this may contribute to the high cost of the chip package 105. In some examples, the cost of the chip package 105 including the interposer 114 may be more expensive than the cost of the chip package 103 formed by means of the thermo-compression bonding process.

As described above, routing (e.g. electrical routing) may be provided on the circuit board 104 or the interposer 114.

Figure 1E:
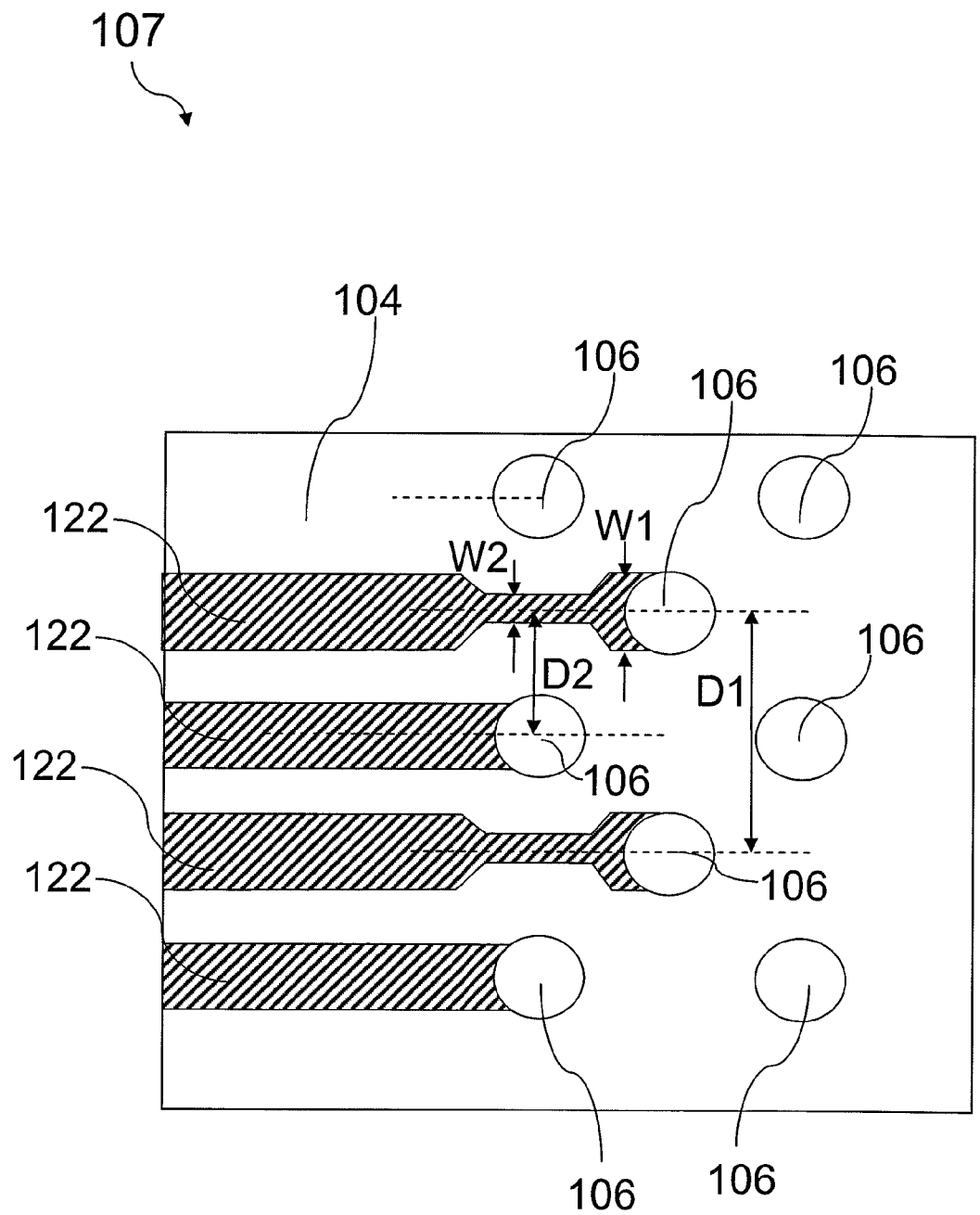
FIG. 1E shows a view of at least one of the chip packages shown in FIG. 1A to FIG. 1D.

FIG. 1E shows a view 107 of at least one of the chip packages shown in FIG. 1A to FIG. 1D along the line A-A'.

The view 107 shows routing 122 (e.g. electrical routing) that may be provided on the circuit board 104 or the interposer 114 (e.g. on the surface 104a of the circuit board 104 shown in FIG. 1A). As shown in FIG. 1E, a width W1, W2 of the routing 122 (which may be referred to as a line width of the routing 122) provided on the circuit board 104 (e.g. on the surface 104a of the circuit board 104) may depend on a distance D1, D2 between the routing 122 and an adjacent interconnect 106. For example, in case the distance D1 between the routing 122 and an adjacent interconnect 106 is large, the line width W1 of the routing 122 may be large. Conversely, in case the distance D2 between the routing 122 and an adjacent interconnect 106 is small, the line width W2 of the routing 122 may be small. In other words, design rules for line widths W1, W2 of the routing 122 may have to be adapted depending on neighboring interconnects 106. This may be required to accommodate the routing 122 between adjacent interconnects 106. A variation in the linewidth W1, W2 of the routing 122 may lead to reduced electrical performance (e.g. current carrying capability, resistance, conductivity, inductivity) and/or reliability of the routing 122. Also, if the distance D1 between adjacent interconnects 106 becomes too small, it may be difficult or even impossible to lead a routing 122 in-between adjacent interconnects 106 and thus it may be difficult or even impossible to connect at least some of the interconnects 106.

Figure 1F:
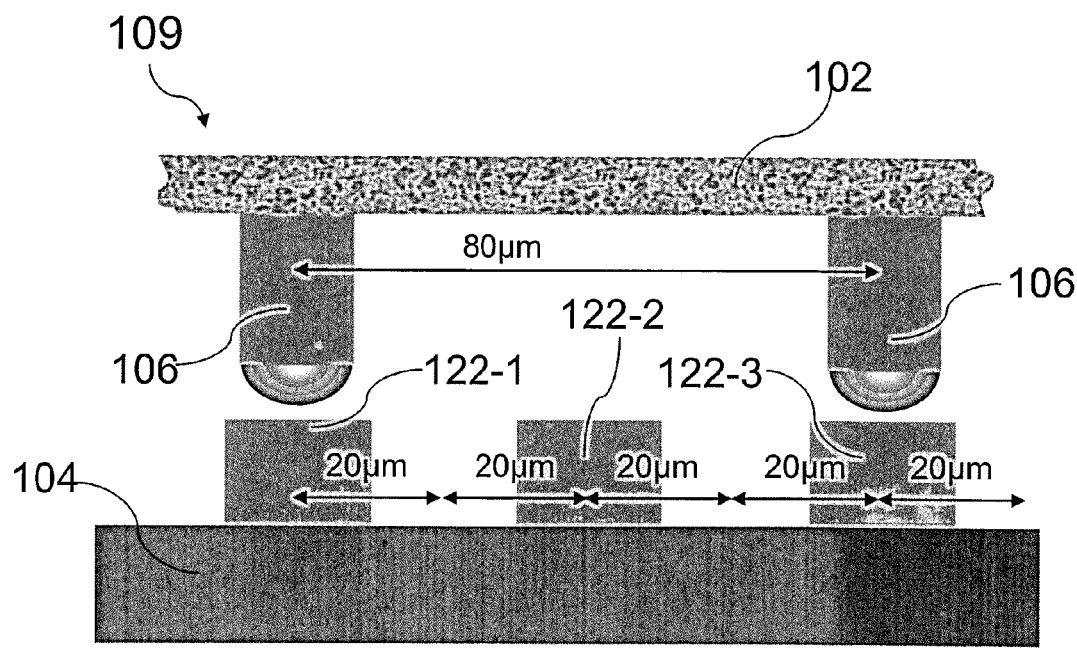
FIG. 1F shows a section of a chip package where a distance between adjacent interconnects of a chip is about 80 µm and where a pitch of a routing provided on a circuit board may be about 40 µm.

FIG. 1F shows a section of a chip package 109 where the distance between adjacent interconnects 106 of the chip 102 is about 80 µm and where a pitch of the routing 122-1, 122-2, 122-3 provided on the circuit board 104 may be about 40 µm. The pitch of about 40 µm of the routing 122-1, 122-2, 122-3 may be the result of a line/space requirement, which may be 20/20 µm in the present case. The line/space requirement of 20/20 µm, or correspondingly the routing pitch of about 40 µm, may be imposed by design. In the chip package 109, one routing 122-2 may be led in-between adjacent interconnects 106.

As described above, in case the distance between adjacent interconnects 106 becomes too small, it may be difficult or even impossible to lead a routing 122 in-between adjacent interconnects 106. This may be seen in the chip package 111 shown in FIG. 1G.

Figure 1G:
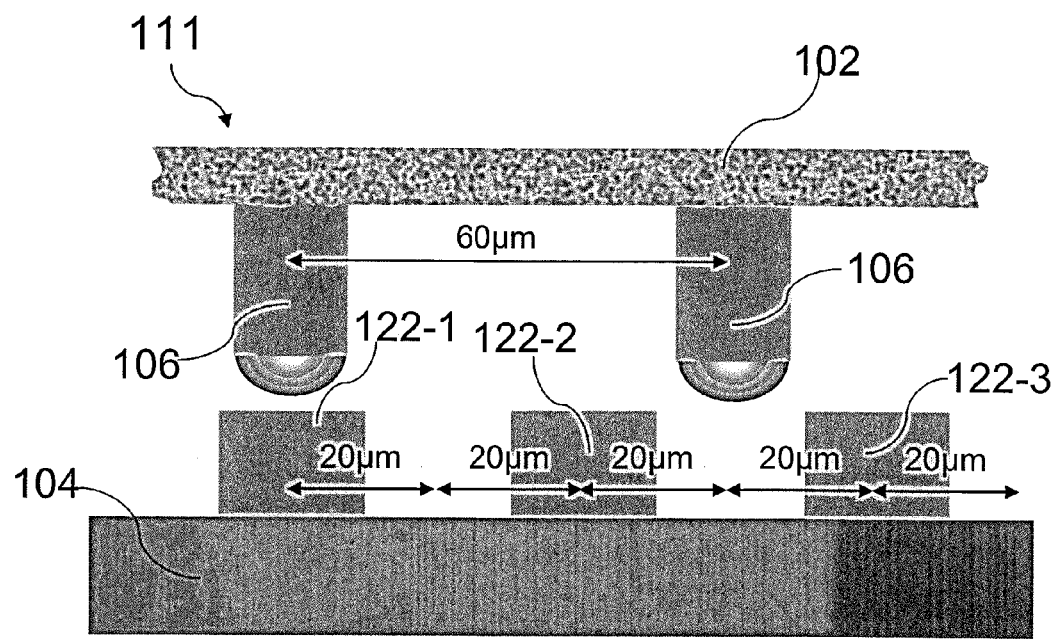
FIG. 1G shows a section of a chip package where a distance between adjacent interconnects of a chip is about 60 µm and where a line/space requirement of routing provided on a circuit board is about 20/20 µm.

FIG. 1G shows a section of a chip package 111 where the distance between adjacent interconnects 106 of the chip 102 is about 60 µm and where the line/space requirement of routing provided on the circuit board 104 is about 20/20 µm.

As shown in FIG. 1G, the pitch of the interconnects 106 and the line/space requirement of about 20/20 µm may be incompatible with each other. For example, the line/space requirement of about 20/20 µm leads to no capability of leading the routing 122-2 in-between adjacent interconnects 106 having a pitch of about 60 µm.

Figure 1H:
FIG. 1H shows a table indicating the number of routing lines that may be routed in-between adjacent interconnects for a given pitch of the interconnects and a given line/space design requirement.

FIG. 1H shows a table 113 indicating the number of routing lines 122 that may conventionally be routed in-between adjacent interconnects for a given pitch of the interconnects (denoted "FC pitch" in table 113) (in µm) and a given line/space design requirement (denoted "Line/Space" in table 113) (in µm). For example, for an interconnect pitch of 80 µm and a line/space design requirement of 20/20 µm, one routing line may conventionally be routed in-between adjacent interconnects, while for an interconnect pitch of 60 µm and a line/space design requirement of 20/20 µm, no routing line may conventionally be routed in-between adjacent interconnects.

In view of the above-mentioned considerations related to the chip packages shown in FIG. 1A to FIG. 1F, the following needs may be identified:

There may be a need to increase a distance between neighboring interconnects (e.g. adjacent interconnects) without increasing a lateral extent of a chip and/or an interposer and/or a circuit board.

There may be a need to provide space between neighboring interconnects (e.g. adjacent interconnects), which may be used for forming routing (e.g. electrical routing) that may be disposed between the neighboring interconnects.

There may be a need to provide a constant width for routing (e.g. electrical routing) that may be disposed between the neighboring interconnects.

There may be a need to reduce manufacturing cost of an interposer and/or a chip package that may include the interposer.

Figure 2:
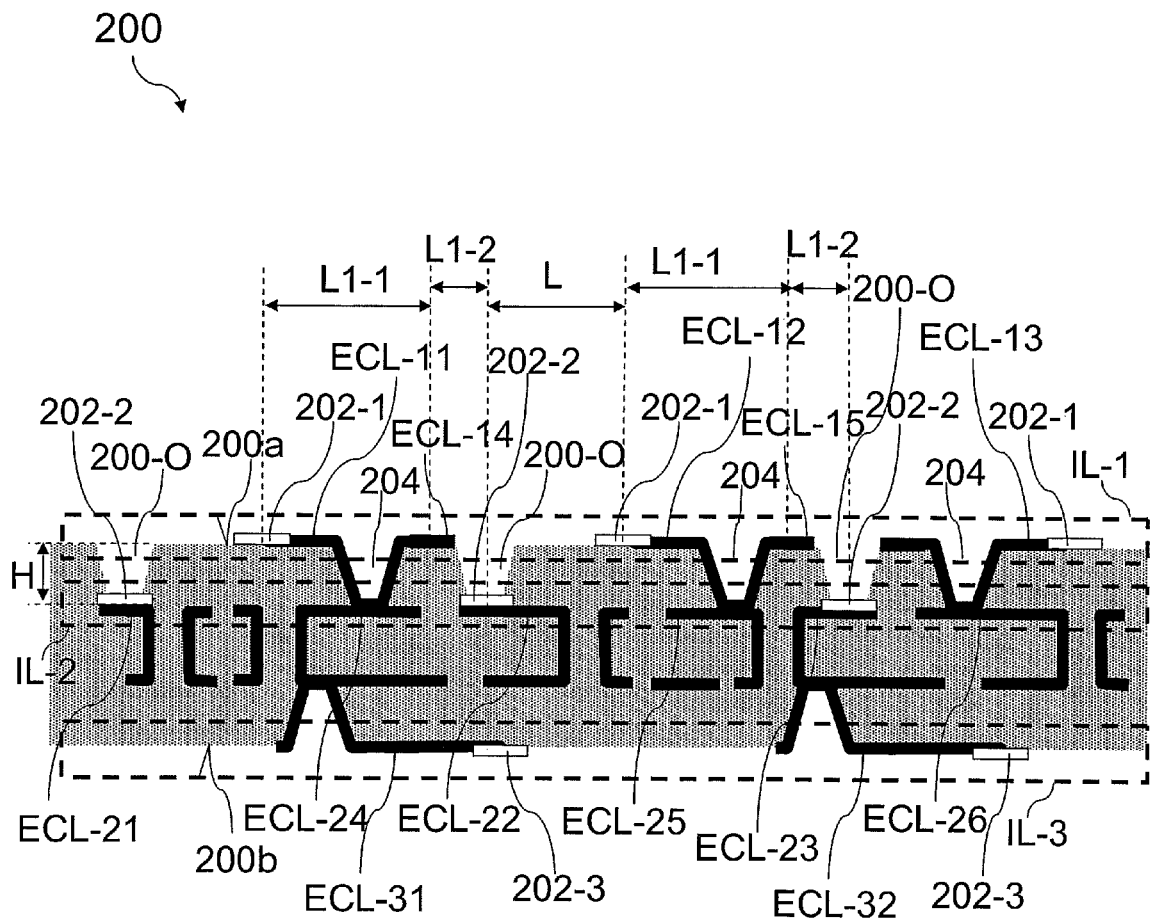
FIG. 2 shows a chip interposer.

These needs may, for example, be met by the chip interposer shown in FIG. 2.

FIG. 2 shows a chip interposer 200.

The chip interposer 200 may include, or may be, a circuit board (e.g. a printed circuit board). For example, the chip interposer 200 may be used in place of the circuit board 104 shown in FIG. 1A to FIG. 1C, or the interposer 114 and the circuit board 104 shown in FIG. 1D.

The chip interposer 200 may include, or may be, an interposer (e.g. a 2.5 D interposer), which may be used to couple (e.g. electrically couple) a chip (e.g. the chip 102) and a circuit board (e.g. the circuit board 104) to each other. For example, the chip interposer 200 may be used in place of the interposer 114 shown in FIG. 1D.

The chip interposer 200 may include a first interconnect level IL-1 and a second interconnect level IL-2. The first interconnect level IL-1 and the second interconnect level IL-2 may be different interconnect levels. For example, the first interconnect level IL-1 and the second interconnect level IL-2 may be disposed at different levels (e.g. different vertical levels) of the chip interposer 200. For example, in the chip interposer 200 shown in FIG. 2, the first interconnect level IL-1 may be disposed at a higher level, e.g. closer to a first surface 200a (e.g. frontside) of the chip interposer 200, than the second interconnect level IL-2.

The chip interposer 200 may include a first surface 200a (e.g. a frontside) and a second surface 200b (e.g. a backside) opposite the first surface 200a (e.g. frontside). In other words, the first surface 200a (e.g. frontside) of the chip interposer 200 may face away from the second surface 200b (e.g. backside) of the chip interposer 200, and vice versa. The first interconnect level IL-1 may be disposed at the first surface 200a (e.g. frontside) of the chip interposer 200, and the second interconnect level IL-2 may be disposed below the first surface 200a (e.g. frontside) of the chip interposer 200. For example, the second interconnect level IL-2 shown in FIG. 2 may be disposed within a bulk of the chip interposer 200, which may be disposed below the first surface 200a (e.g. frontside) of the chip interposer 200, as shown in FIG. 2.

A height difference H between the first interconnect level IL-1 and the second interconnect level IL-2 may be less than or equal to about 50 µm, e.g. less than or equal to about 40 µm, e.g. less than or equal to about 30 µm, e.g. less than or equal to about 20 µm, e.g. in the range from about 20 µm to about 50 µm, e.g. in the range from about 20 µm to about 40 µm, e.g. in the range from about 20 µm to about 30 µm, although other heights H may be possible as well.

The first interconnect level IL-1 may include at least one first pad 202-1, and the second interconnect level IL-2 may include at least one second pad 202-2, which may face in the same direction as the first pad 202-1.

As described above, the second interconnect level IL-2 may be disposed below the first surface 200a (e.g. frontside) of the chip interposer 200. Accordingly, the second pad 202-2 (which may be disposed below the first surface 200a (e.g. frontside) of the chip interposer 200) may be disposed below (in other words, in a lower level than) the first pad 202-1 (which may be disposed at the first surface 200a (e.g. frontside) of the chip interposer 200). The second pad 202-2, which may be disposed below the first surface 200a (e.g. frontside) of the chip interposer 200, may be exposed, for example, by means of an opening 200-O, which may extend from the first surface 200a (e.g. frontside) of the chip interposer 200. For example, at least a portion of a surface of the second pad 202-2 may be exposed from the first surface 200a (e.g. frontside) of the chip interposer 200, e.g. by the opening 200-O. The opening 200-O may include, or may be, a trench, a hole or a via. Consequently, the first pad 202-1 (which may be included in the first interconnect level IL-1) and the second pad 202-2 (which may be included in the second interconnect level IL-2) may face in the same direction as the first surface 200a (e.g. frontside) of the chip interposer 200, as shown in FIG. 2.

A depth of the opening 200-O that may expose the second pad 202-2 from the first side 200a (e.g. frontside) of the chip interposer 200 may be less than or equal to about 50 µm, e.g. less than or equal to about 40 µm, e.g. less than or equal to about 30 µm, e.g. less than or equal to about 20 µm, e.g. in the range from about 20 µm to about 50 µm, e.g. in the range from about 20 µm to about 40 µm, e.g. in the range from about 20 µm to about 30 µm, although other depths may be possible as well.

The first pad 202-1 and the second pad 202-2 may be separated by a lateral distance L. The lateral distance L between the first pad 202-1 and the second pad 202-2 may be less than or equal to about 100 µm, e.g. less than or equal to about 90 µm, e.g. less than or equal to about 80 µm, e.g. less than or equal to about 70 µm, e.g. less than or equal to about 60 µm, e.g. less than or equal to about 50 µm, e.g. less than or equal to about 40 µm, e.g. less than or equal to about 30 µm, e.g. less than or equal to about 20 µm, although other lateral distances L may be possible as well. For example, the lateral distance L between the first pad 202-1 and the second pad 202-2 may be in the range from about 20 µm to about 100 µm, e.g. in the range from about 30 µm to about 60 µm.

The first interconnect level IL-1 may include at least one electrically conductive line ECL-11, ECL-12, ECL-13. For example, in the chip interposer 200 shown in FIG. 2, the first interconnect level IL-1 may include a plurality of electrically conductive lines ECL-11, ECL-12, and ECL-13. The at least one electrically conductive line ECL-11, ECL-12, ECL-13 may run at least substantially parallel to the first surface 200a of the chip interposer 200, as shown in FIG. 2.

The at least one electrically conductive line ECL-11, ECL-12, ECL-13 may be at least a part of a metallization layer, which may be included in the first interconnect level IL-1. For example, the at least one electrically conductive line ECL-11, ECL-12, ECL-13 may be at least a part of a metallization layer (e.g. a frontside metallization layer), which may be disposed at the first surface 200a of the chip interposer 200, and which may be included in the first interconnect level IL-1.

The at least one electrically conductive line ECL-11, ECL-12, ECL-13 of the first interconnect level IL-1 may be coupled (e.g. electrically coupled) to the first pad 202-1. In an example where the first interconnect level IL-1 may include a plurality of electrically conductive lines ECL-11, ECL-12, ECL-13, at least one electrically conductive line may be coupled (e.g. electrically coupled) to the first pad 202-1. For example, in the chip interposer 200 shown in FIG. 2, each electrically conductive line of the plurality of electrically conductive lines ECL-11, ECL-12, and ECL-13 may be coupled (e.g. electrically coupled) to a respective first pad 202-1.

In like manner, the second interconnect level IL-2 may include at least one electrically conductive line ECL-21, ECL-22, ECL-23. For example, in the chip interposer 200 shown in FIG. 2, the first interconnect level IL-2 may include a plurality of electrically conductive lines ECL-21, ECL-22, and ECL-23. The at least one electrically conductive line ECL-21, ECL-22, ECL-23 may run at least substantially parallel to the first surface 200a of the chip interposer 200, as shown in FIG. 2.

The at least one electrically conductive line ECL-21, ECL-22, ECL-23 may be at least a part of a metallization layer, which may be included in the second interconnect level IL-2. For example, the at least one electrically conductive line ECL-21, ECL-22, ECL-23 may be at least a part of a metallization layer, which may be disposed at least within a bulk of the chip interposer 200, and which may be included in the second interconnect level IL-2.

The at least one electrically conductive line ECL-21, ECL-22, ECL-23 of the second interconnect level IL-2 may be coupled (e.g. electrically coupled) to the second pad 202-2. In an example where the second interconnect level IL-2 may include a plurality of electrically conductive lines ECL-21, ECL-22, ECL-23, at least one electrically conductive line may be coupled (e.g. electrically coupled) to the second pad 202-2. For example, in the chip interposer 200 shown in FIG. 2, each electrically conductive line of the plurality of electrically conductive lines ECL-21, ECL-22, and ECL-23 is coupled (e.g. electrically coupled) to a respective second pad 202-2.

The second interconnect level IL-2 may include at least one electrically conductive line ECL-24, ECL-25, ECL-26, which may be coupled (e.g. electrically coupled) to the first pad 202-1. For example, the chip interposer 200 may include a via 204 which may couple (e.g. electrically couple) the first pad 202-1 and the at least one electrically conductive line ECL-24, ECL-25, ECL-26 to each other. As shown in FIG. 2, the via 204 may be coated with an electrically conductive material (e.g. metal or metal alloy), which may couple (e.g. electrically couple) the first pad 202-1 and the at least one electrically conductive line ECL-24, ECL-25, ECL-26 to each other. In another example, the via 204 may be at least partially filled with an electrically conductive material (e.g. metal or metal alloy), which may couple (e.g. electrically couple) the first pad 202-1 and the at least one electrically conductive line ECL-24, ECL-25, ECL-26 to each other.

The first interconnect level IL-1 may include an electrically conductive line that may be laterally disposed between the first pad 202-1 and the second pad 202-2. For example, in the chip interposer 200 shown in FIG. 2, the first interconnect level IL-1 may include an electrically conductive line ECL-14, ECL-15 laterally disposed between the first pad 202-1 and the second pad 202-1.

A lateral distance L1-1, L1-2 between the electrically conductive line ECL-14, ECL-15 and at least one of the first pad 202-1 (e.g. indicated as lateral distance L1-1) and the second pad 202-2 (e.g. indicated as lateral distance L1-2) may be less than or equal to about 30 μm, e.g. less than or equal to about 20 μm, e.g. less than or equal to about 10 μm, although other lateral distances L1 may be possible as well.

As shown in FIG. 2, the chip interposer 200 may include a first interconnect level IL-1 and a second interconnect level IL-2, wherein each interconnect level may include a pad that may face in the same direction as the first surface 200a of the chip interposer 200. In another example, the chip interposer 200 may include at least one additional interconnect level, which may include at least one additional pad which may face in the same direction as the first pad 202-1 and the second pad 202-2. Accordingly, the chip interposer 200 may include two or more interconnect levels, wherein each interconnect level may include a pad that may face in the same direction as the first surface 200a of the chip interposer 200.

The chip interposer 200 may include a third interconnect level IL-3 disposed at the second surface 200b (e.g. a backside) of the chip interposer 200. The third interconnect level IL-3 may include at least one third pad 202-3, which may face in the same direction as the second surface 200b (e.g. backside) of the chip interposer 200. As described above, the first pad 202-1 (which may be included in the first interconnect level IL-1) and the second pad 202-2 (which may be included in the second interconnect level IL-2) may face in the same direction as the first surface 200a (e.g. frontside) of the chip interposer 200, as shown in FIG. 2. Consequently, the third pad 202-3 (which may be disposed at the second surface (e.g. a backside) 200b of the chip interposer 200), may face in an opposite direction than the first pad 202-1 and the second pad 202-2.

The third pad 202-3 may be coupled (e.g. electrically coupled) to at least one of the first pad 202-1 and the second pad 202-2. For example, in the chip interposer 200 shown in FIG. 2, the third pad 202-3 may be coupled (e.g. electrically coupled) to the first pad 202-1 by means of the electrically conductive lines ECL-31, ECL-24, and ECL-11. By way of another example, in the chip interposer 200 shown in FIG. 2, the third pad 202-3 may be coupled (e.g. electrically coupled) to the second pad 202-2 by means of the electrically conductive lines ECL-32, and ECL-23.

At least one of the first pad 202-1, the second pad 202-2 and the third pad 202-3 may include, or may consist of, an electrically conductive material. The electrically conductive material may include at least one of a metal and a metal alloy. For example, at least one of the first pad 202-1, the second pad 202-2 and the third pad 202-3 may include, or may consist of, copper, nickel, gold, palladium, titanium, chrome, tungsten or aluminum or a metal alloy or metal stack including one or more of the above mentioned materials.

The chip interposer 200 (e.g. a bulk of the chip interposer 200) may include, or may consist of, an insulating material (e.g. laminate material and/or prepreg material). The chip interposer 200 (e.g. a bulk of the chip interposer 200) may include at least two layers or levels (e.g. at least four layers or levels, e.g. at least six layers or levels, etc.). A layer or level of the chip interposer 200 may, for example, correspond to a respective interconnect layer or level (e.g. first interconnect level IL-1 or second interconnect level IL-2) of the chip interposer 200.

The chip interposer 200 may include, or may consist of, a stack of conductive layers (e.g. the electrically conductive lines ECL-11 to ECL-16, ECL-21 to ECL-26, ECL-31 and ECL-32) and non-conductive layers (e.g. the bulk of the chip interposer 200 including or consisting of an insulating material).

The chip interposer 200 may be formed by means of a lamination process. For example, a stack of layers including a plurality of conductive layers (e.g. the electrically conductive lines ECL-11 to ECL-16, ECL-21 to ECL-26, ECL-31 and ECL-32) and at least one non-conductive layer (e.g. the bulk of the chip interposer 200 including or consisting of an insulating material) may be laminated together. An insulating layer (e.g. a dielectric layer and/or a solder stop layer) may be formed thereafter (e.g. by means of deposition) over the first and second surfaces 200a and 200b of the chip interposer 200.

The opening 200-O of the chip interposer 200 may be formed by means of a drilling process (e.g. laser drilling process). The depth of the opening 200-O formed by means of the drilling process (e.g. laser drilling process) may depend on a position of the electrically conductive lines ECL-21 to ECL-26 disposed within a bulk of the chip interposer 200. For example, a laser beam used in the drilling process may penetrate within the bulk of the chip interposer 200 and may expose at least a part of a suface of the electrically conductive lines ECL-21 to ECL-26 disposed within the bulk of the chip interposer 200.

The chip interposer 200 shown in FIG. 2 may be packaged with a chip to form a semiconductor device.

Figure 3:
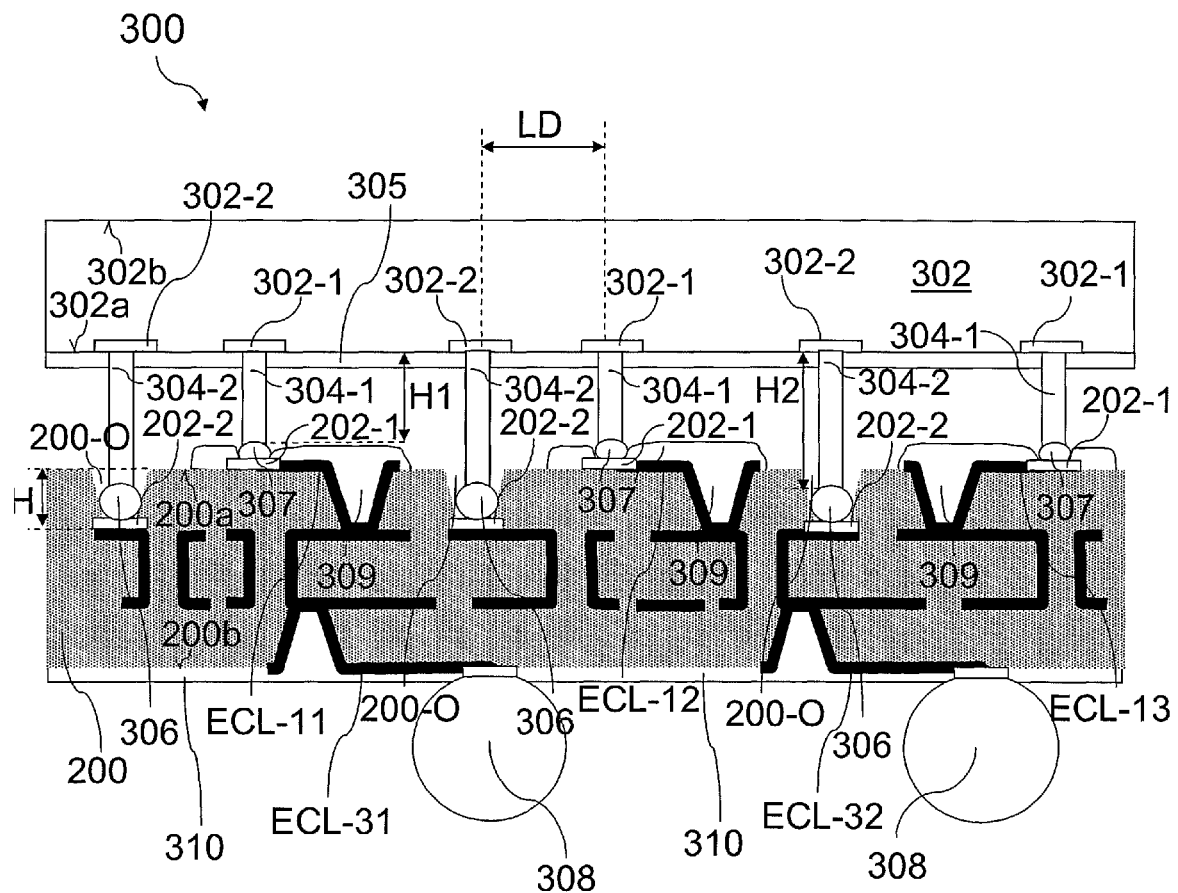
FIG. 3 shows a semiconductor device including a chip interposer and a chip.

FIG. 3 shows a semiconductor device 300 including the chip interposer 200 and a chip 302.

Reference signs in FIG. 3 that are the same as in FIG. 2 denote the same or similar elements as in FIG. 2. Thus, those elements will not be described in detail again here; reference is made to the description above. Differences between FIG. 3 and FIG. 2 are described below.

The semiconductor device 300 may include the chip 302, which may be disposed over the chip interposer 200.

The chip 302 may include a first surface 302a (e.g. frontside or bottom surface or active side) and a second surface 302b (e.g. backside or top surface) opposite the first surface 302a. The first surface 302a of the chip 302 may face the chip interposer 200, as shown in FIG. 3. The semiconductor device 300 may be configured as a flip-chip package. For example, the first surface 302a of the chip 302, which may face the chip interposer 200, may be an active surface of the chip 302.

The chip 302 may include at least one first pad 302-1 and at least one second pad 302-2, which may be formed at the first surface 302a of the chip 302. The first pad 302-1 and/or the second pad 302-2 of the chip 302 may include, or may consist of, an electrically conductive material. The electrically conductive material may include at least one of a metal and a metal alloy. For example, the first pad 302-1 and/or the second pad 302-2 may include, or may consist of, copper, nickel, gold, palladium, titanium, chrome, tungsten or aluminum or a metal alloy or metal stack including one or more of the above mentioned materials.

A lateral distance LD between the first pad 302-1 and the second pad 302-2 of the chip 302 may be less than or equal to about 100 μm, e.g. less than or equal to about 90 μm, e.g. less than or equal to about 80 μm, e.g. less than or equal to about 70 μm, e.g. less than or equal to about 60 μm, e.g. less than or equal to about 50 μm, e.g. less than or equal to about 40 μm, e.g. less than or equal to about 30 μm, e.g. less than or equal to about 20 μm. By way of another example, the lateral distance LD between the first pad 302-1 and the second pad 302-2 of the chip 302 may be in the range from about 20 μm to about 100 μm, e.g. in the range from about 30 μm to about 60 μm.

The lateral distance LD may be, or may correspond to, a pad pitch of the chip 302. Accordingly, the chip 302 shown in FIG. 3 may include, or may be, a chip wherein the pitch LD of the pads 302-1 and 302-2 of the chip 302 is small (e.g. less than about 100 μm, e.g. in the range from about 20 μm to about 100 μm). The chip 302 may include an insulating layer 305 formed at the first surface 302a of the chip 302. The insulating layer 305 may include, or may be, a dielectric layer.

The first pad 302-1 of the chip 302 may be coupled (e.g. electrically coupled) to the first pad 202-1 of the first interconnect level IL-1 of the chip interposer 200, and the second pad 302-2 of the chip 302 may be coupled (e.g. electrically coupled) to the second pad 202-2 of the second interconnect level IL-2 of the chip interposer 200.

The semiconductor device 300 may include a first interconnect 304-1, which may couple (e.g. electrically couple) the first pad 302-1 of the chip 302 to the first pad 202-1 of the first interconnect level IL-1 of the chip interposer 200. The semiconductor device 300 may include a second interconnect 304-2, which may couple (e.g. electrically couple) the second pad 302-2 of the chip 302 to the second pad 202-2 of the second interconnect level IL-2 of the chip interposer 200.

The first interconnect 304-1 and/or the second interconnect 304-2 may include, or may consist of, an electrically conductive material. The electrically conductive material may include at least one of a metal and a metal alloy. For example, the first interconnect 304-1 and/or the second interconnect 304-2 may include, or may consist of, copper, nickel, gold, palladium, titanium, chrome, tungsten or aluminum or a metal alloy or metal stack including one or more of the above mentioned materials.

The first and second interconnects 304-1 and 304-2 may be configured as pillars (e.g. metal pillars, e.g. copper pillars). In other words, the first interconnect 304-1 may include, or may be, a first pillar (e.g. metal pillar, e.g. copper pillar), and the second interconnect 304-2 may include, or may be, a second pillar (e.g. metal pillar, e.g. copper pillar).

As shown in FIG. 3, the first interconnect 304-1 (e.g. metal pillar, e.g. copper pillar) may have a first height H1, which may refer to the furthest extent of the first interconnect 304-1 in a direction perpendicular to the first surface 302a of the chip 302. The second interconnect 304-2 (e.g. metal pillar, e.g. copper pillar) may have a second height H2, which may be measured in a similar manner as the first height H1 of the first interconnect 304-1. The second height H2 may be greater than the first height H1.

The first interconnect 304-1 (e.g. metal pillar, e.g. copper pillar) and/or the second interconnect 304-2 (e.g. metal pillar, e.g. copper pillar) may be formed by means of a plating process. The plating process may include a use of at least one plating mask, which may be used to provide the different heights between the first interconnect 304-1 (e.g. metal pillar, e.g. copper pillar) and the second interconnect 304-2 (e.g. metal pillar, e.g. copper pillar).

As described above, the semiconductor device 300 may include the first interconnect 304-1 that may couple (e.g. electrically couple) the first pad 302-1 of the chip 302 to the first pad 202-1 of the first interconnect level IL-1 of the chip interposer 200. The first interconnect 304-1 may be disposed between the first pad 302-1 of the chip 302 and the first pad 202-1 of the first interconnect level IL-1 of the chip interposer 200, and may couple (e.g. electrically couple) the first pad 302-1 of the chip 302 and the first pad 202-1 of the first interconnect level IL-1 of the chip interposer 200 to each other.

The semiconductor device 300 may include an electrically conductive interconnect element 307 disposed over the first pad 202-1 of the first interconnect level IL-1 of the chip interposer 200. The electrically conductive interconnect element 307 may include, or may consist of, an electrically conductive material. The first interconnect 304-1, which may be disposed between the first pad 302-1 of the chip 302 and the first pad 202-1 of the first interconnect level IL-1 of the chip interposer 200, may be in contact (e.g. physical contact, e.g. direct physical contact) with the electrically conductive interconnect element 307.

As shown in FIG. 3, the semiconductor device 300 may include an insulating layer 309, which may include a dielectric layer and/or a solder stop layer. The insulating layer 309 may be formed over a part of the first surface 200a of the chip interposer 200. For example, the insulating layer 309 may be formed over the at least one electrically conductive line ECL-11, ECL-12, ECL-13 and over at least a part of the first pad 202-1 of the first interconnect level IL-1 of the chip interposer 200.

As described above, the semiconductor device 300 may include a second interconnect 304-2 that may couple (e.g. electrically couple) the second pad 302-2 of the chip 302 to the second pad 202-2 of the second interconnect level IL-2 of the chip interposer 200. The second interconnect 304-2 may be disposed between the second pad 302-2 of the chip 302 and the second pad 202-2 of the second interconnect level IL-2 of the chip interposer 200.

As described above in relation to FIG. 2, the chip interposer 200 may include the opening 200-O, which may extend from the first surface 200a (e.g. frontside) of the chip interposer 200, and which may expose at least a portion of a surface of the second pad 202-2. An electrically conductive filling element 306 may be disposed in the opening 200-O, and may at least partially fill the opening 200-O. The electrically conductive filling element 306 may be confined in the opening 200-O (e.g. trench, hole, via) which may expose at least a portion of a surface of the second pad 202-2.

The second interconnect 304-2 (e.g. metal pillar, e.g. copper pillar), which may be disposed between the second pad 302-2 of the chip 302 and the second pad 202-2 of the second interconnect level IL-2 of the chip interposer 200, may be in contact (e.g. physical contact, e.g. direct physical contact) with the electrically conductive filling element 306.

As described above, the second height H2 of the second interconnect 304-2 (e.g. metal pillar, e.g. copper pillar) may be greater than the first height H1 of the first interconnect 304-1 (e.g. metal pillar, e.g. copper pillar). In another example, the second height H2 of the second interconnect 304-2 and the first height H1 of the first interconnect 304-1 may be substantially equal. In such an example, the electrically conductive filling element 306 disposed in the opening 200-O may compensate for the larger distance between the second pad 302-2 of the chip 302 and the second pad 202-2 of the second interconnect layer IL-2 of the chip interposer 200. In other words, the electrically conductive filling element 306 disposed in the opening 200-O may be used to fill the opening 200-O (e.g. trench, hole, via) leading to the second pad 202-2 in the lower second interconnect level IL-2, thus at least partially (e.g. fully) leveling out the height difference H between the second pad 202-2 and the first pad 202-1 of the chip interposer 200.

The electrically conductive filling element 306 may include, or may be, at least one of the following: solder paste, a solder ball, a metal ball (e.g. a copper ball), a metal alloy ball, and a solder ball having a metal or metal alloy core (e.g. metal core solder ball, e.g. copper core solder ball). For example, the electrically conductive filling element 306 may include, or may be, a metal core solder ball (e.g. copper core solder ball) that may be used to fill the opening 200-O (e.g. trench, hole, via) leading to the second pad 202-2 of the lower second interconnect level IL-2.

The electrically conductive filling element 306 may be formed in the opening 200-O by means of a printing process. For example, the electrically conductive filling element 306 (e.g. solder paste) may be printed into the opening 200-O exposing the second pad 202-2 of the lower second interconnect level IL-2. The printing process may include a reflow process.

The electrically conductive filling element 306 may be formed in the opening 200-O by means of a placing process. For example, the electrically conductive filling element 306 (e.g. preformed solder ball or copper ball) may be placed into the opening 200-O exposing the second pad 202-2 of the lower second interconnect level IL-2. A reflow process may be performed after placing the electrically conductive filling element 306 (e.g. preformed solder ball or copper ball) into the opening 200-O.

The semiconductor device 300 may include a ball grid array including a plurality of balls 308 (e.g. solder balls), which may be disposed at the second surface 200b of the chip interposer 200. In other words, the plurality of balls 308 (e.g. solder balls) may face away from the chip 302. The semiconductor device 300 may include an insulating layer 310, which may include a dielectric layer and/or a solder stop layer. The insulating layer 310 may be formed over a part of the second surface 200b of the chip interposer 200. For example, the insulating layer 310 may be formed over the at least one electrically conductive line ECL-31, ECL-32 and over at least a part of the third pad 202-3 of the third interconnect level IL-3 of the chip interposer 200.

As shown in FIG. 3, the chip 302 may be connected (e.g. electrically connected) to the chip interposer 300 in two or more levels (or planes). For example, the first pad 302-1 of the chip 302 may be connected (e.g. electrically connected) at a first level to the first pad 202-1 of the first interconnect level IL-1 of the chip interposer 200, and the second pad 302-2 of the chip 302 may be connected (e.g. electrically connected) at a second level (e.g. a lower level) to the second pad 202-2 of the second interconnect level IL-2 of the chip interposer 200. Consequently, a pitch of the interconnection between the chip 302 having a small pitch LD (e.g. less than about 100 μm) and the chip interposer 200 may be relaxed by separating the interconnection between the chip 302 and the chip interposer 200 into two or more interconnection levels.

An effect provided by the chip interposer 200 may be an increase in a distance between neighboring interconnects (e.g. adjacent interconnects) of a given level (or plane), e.g. neighboring first interconnects 304-1 or neighboring second interconnects 304-2 shown in FIG. 3.

An effect provided by the chip interposer 200 may be provision of more space between neighboring interconnects (e.g. adjacent interconnects) of a given level (or plane), which may be used for routing between the neighboring interconnects.

An effect provided by the chip interposer 200 may be a relaxation of design rules (e.g. routing design rules) for the chip interposer 200.

An effect provided by the chip interposer 200 may be a reduction in manufacturing cost of the chip interposer 200.

Figure 4:
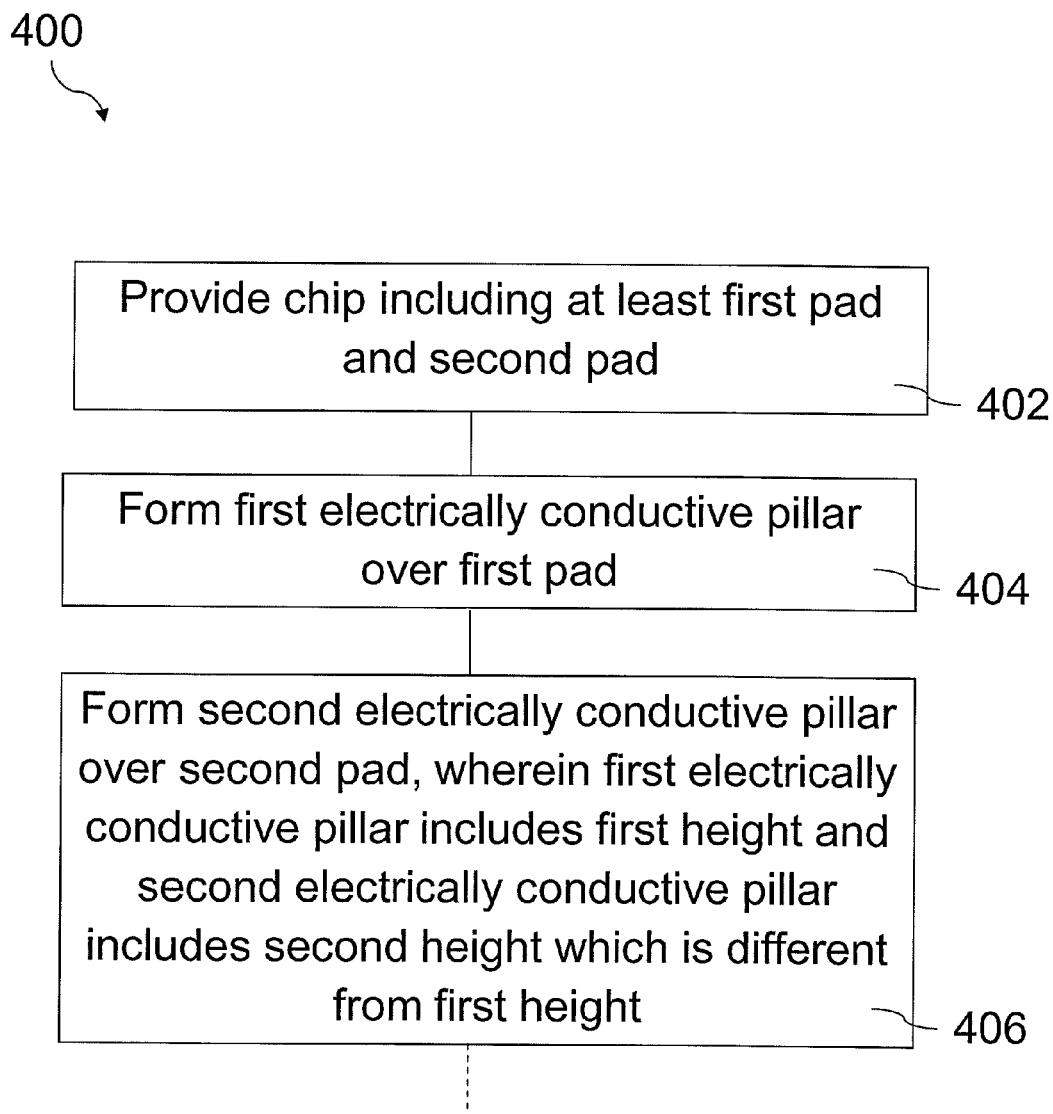
FIG. 4 shows an exemplary method for manufacturing a semiconductor device.

FIG. 4 shows a method 400 for manufacturing a semiconductor device.

The method 400 may be used, for example, to manufacture the semiconductor device 300 shown in FIG. 3.

The method 400 may include: providing a chip including at least a first pad and a second pad (in 402); forming a first electrically conductive pillar over the first pad (in 404); and forming a second electrically conductive pillar over the second pad, wherein the first electrically conductive pillar may include a first height and the second electrically conductive pillar may include a second height, which may be different from (e.g. greater than) the first height (in 406).

The method 400 may further include: providing a chip interposer including a first interconnect level including a first pad, and a second interconnect level including a second pad, wherein the second pad may face in the same direction as the first pad (in 408); and attaching the chip to the chip interposer, wherein the first pad of the chip interposer may be attached to the first electrically conductive pillar and the second pad of the chip interposer may be attached to the second electrically conductive pillar (in 410).

FIG. 5A to FIG. 5H show a process flow for the method 400 for manufacturing the semiconductor device.

Figure 5A:
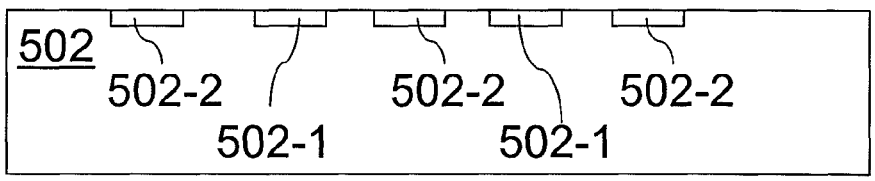
FIG. 5A to FIG. 5H show an exemplary process flow for the method for manufacturing the semiconductor device shown in FIG. 4.

As shown in FIG. 5A in a view 500, a chip 502 may be provided. The chip may be part of a wafer (e.g. silicon wafer), which may include a plurality of chips. The chip 502 may include at least a first pad 502-1 and a second pad 502-2. The chip 502 may, for example, be identified with the chip 302 shown in FIG. 3.

FIG. 5B to FIG. 5G show a process for forming the first and second electrically conductive pillars over the first pad 502-1 and the second pad 502-2, respectively.

Figure 5B:
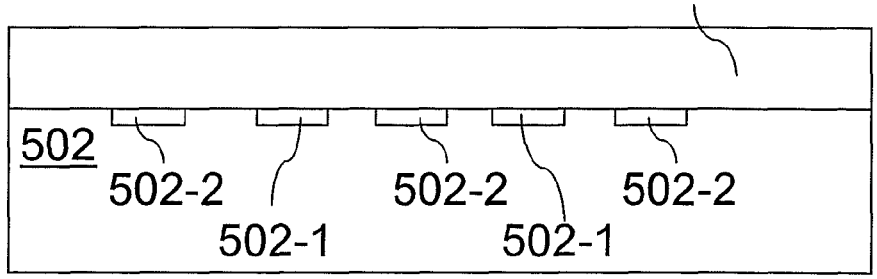

As shown in FIG. 5B in a view 501, a first mask layer 540 may be formed over the chip 502 including the first pad 502-1 and the second pad 502-2. The first mask layer 540 may include, or may consist of, a mask material, e.g. a resist material (e.g. a photoresist). As an example, forming the mask layer 540 may include applying (e.g. laminating, spin-coating) a resist onto the chip 502.

In an example, a seed layer (not shown in FIG. 5B) may be formed over the chip 502, e.g. over the first pad 502-1 and the second pad 502-2, prior to forming the first mask layer 540. In other words, the seed layer may be disposed between the chip 502, e.g. the first pad 502-1 and the second pad 502-2, and the first mask layer 540 shown in FIG. 5B. The seed layer may be formed by means of a sputtering process.

The seed layer may include one or more layers. For example, the seed layer may include a first layer disposed on the chip 502, e.g. on the first pad 502-1 and the second pad 502-2. The first layer of the seed layer may, for example, be in contact (e.g. physical contact, e.g. direct physical contact) with the first pad 502-1 and the second pad 502-2. The first layer of the seed layer may be a bather layer and/or an adhesion promoter layer. The first layer of the seed layer may include, or may consist of, a metal or metal alloy. For example, the first layer of the seed layer may include, or may consist of, titanium (Ti), titanium tungsten (TiW), or chromium (Cr), although other materials may be possible as well. A thickness of the first layer of the seed layer may be in the range from about 30 nm to about 70 nm, e.g. about 50 nm.

The seed layer may include a second layer disposed over the first layer of the seed layer. A thickness of the second layer of the seed layer may be in the range from about 100 nm to about 200 nm, e.g. about 150 nm. The second layer of the seed layer may include, or may consist of, a metal or metal alloy. For example, the second layer of the seed layer may include, or may consist of, copper (Cu) or a copper alloy, although other materials may be possible as well. The second layer of the seed layer may for example, serve as a starting layer for a plating process (e.g. electroplating process).

Figure 5C:
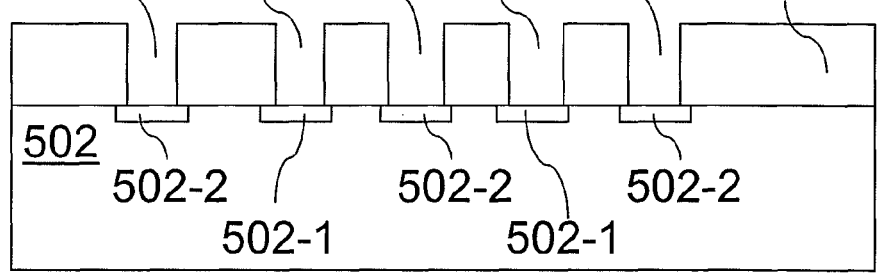

As shown in FIG. 5C in a view 503, the first mask layer 540 may be patterned (e.g. by means of a lithographic process, e.g. a photolithograpic process) to form a first opening 542-1 over the first pad 502-1 (e.g. exposing the first pad 502-1 or a seed layer disposed over the first pad 502-1, if present) and a second opening 542-2 over the second pad 502-2 (e.g. exposing the second pad 502-2 or the seed layer disposed over the second pad 502-2, if present). The first opening 542-1 and the second opening 542-2 may include, or may be, first and second holes, respectively. By way of another example, the first opening 542-1 and the second opening 542-2 may include, or may be, first and second vias, respectively. By way of yet another example, the first opening 542-1 and the second opening 542-2 may include, or may be, first and second trenches, respectively. In an example where a seed layer is provided, the first opening 542-1 and the second opening 542-2 may expose the seed layer disposed over the first pad 502-1 and the second pad 502-2.

Figure 5D:
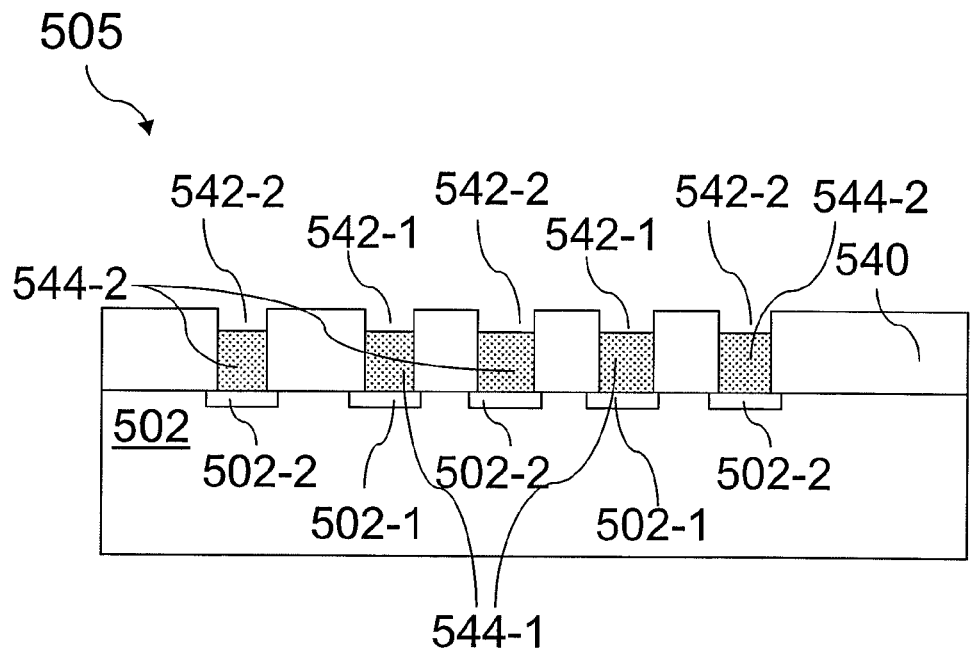

As shown in FIG. 5D in a view 505, the first and second openings 542-1 and 542-2 may be at least partially filled with electrically conductive material, for example, by means of a plating process (e.g. electroplating process and/or electroless plating process). In an example where a seed layer is provided, the seed layer may serve as a starting layer for the plating process.

The electrically conductive material may include or consist of at least one of a metal and a metal alloy. For example, the electrically conductive material may include, or may consist of, copper, nickel, gold, palladium, titanium, chrome, tungsten, tin, lead or aluminum or a metal alloy or metal stack including one or more of the above mentioned materials.

A result of at least partially filling the first and second openings 542-1 and 542-2 with electrically conductive material may be provision of first and second interconnects 544-1 and 544-2 (e.g. metal pillars or posts, e.g. copper pillars or posts) having at least substantially the same height. The first interconnect 544-1 may be formed at least partially within the first opening 542-1, and the second interconnect 544-2 may be formed at least partially within the second opening 542-2.

Figure 5E:
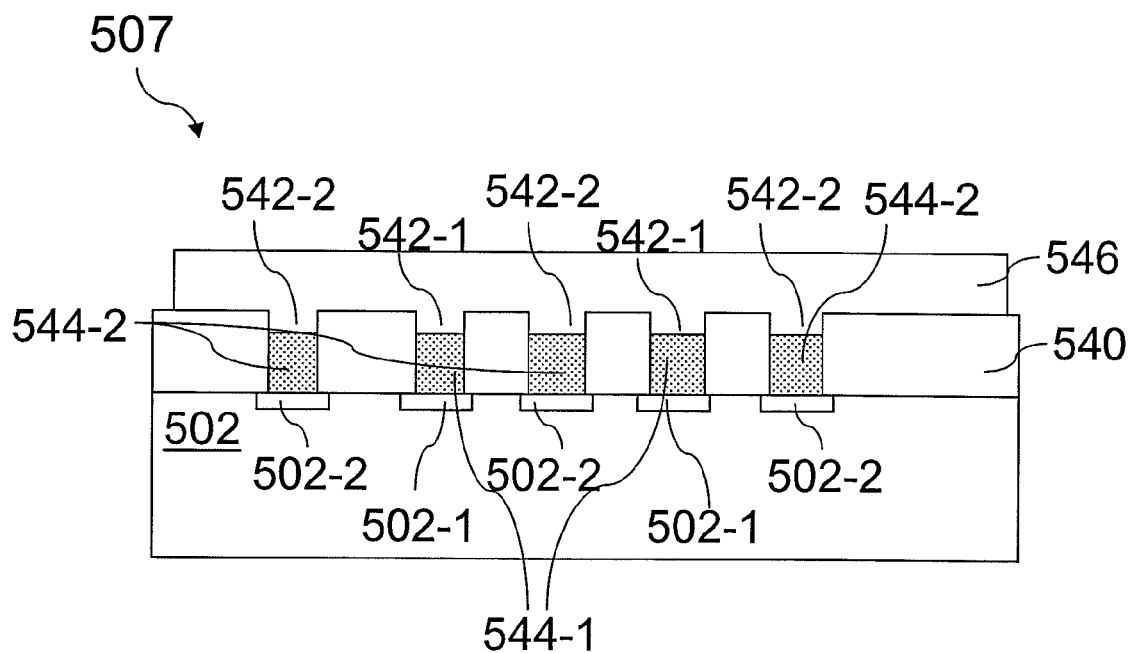

As shown in FIG. 5E in a view 507, a second mask layer 546 may be formed over the patterned first mask layer 540 and the first opening 542-1 and the second opening 542-2. The second mask layer 546 may include, or may consist of, a mask material, e.g. a resist material (e.g. a photoresist). As an example, forming the second mask layer 546 may include applying (e.g. laminating) a resist (e.g dry resist) onto the patterned mask layer 540 and the first and second interconnects 544-1, 544-2.

Figure 5F:
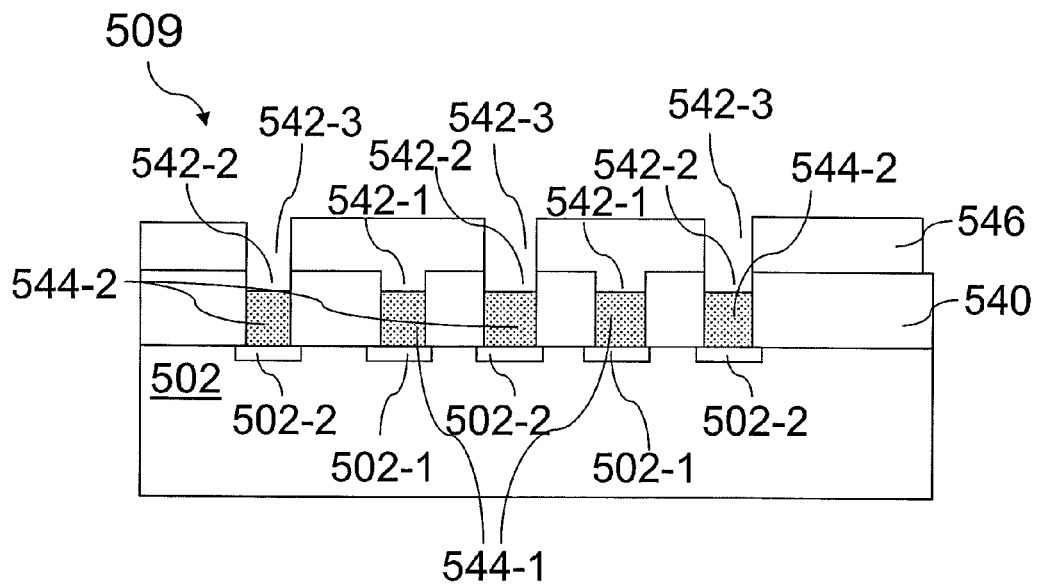

As shown in FIG. 5F in a view 509, the second mask layer 546 may be patterned (e.g. by means of a lithographic process, e.g. a photolithograpic process) to form a third opening 542-3 exposing the second opening 542-2 and/or the interconnect 544-2 formed at least partially within the second opening 542-2. The third opening 542-3 may include, or may be, a third hole, a third via, or a third trench.

A lateral extent of the third opening 542-3 may be at least substantially equal to a lateral extent of the second opening 542-2, as shown in FIG. 5F. In another example, the lateral extent of the third opening 542-3 may be larger than a lateral extent of the second opening 542-2. Accordingly, alignment tolerances for the patterning of the second mask layer 546 (e.g. by means of a lithographic process, e.g. a photolithograpic process) may be relaxed.

Figure 5G:
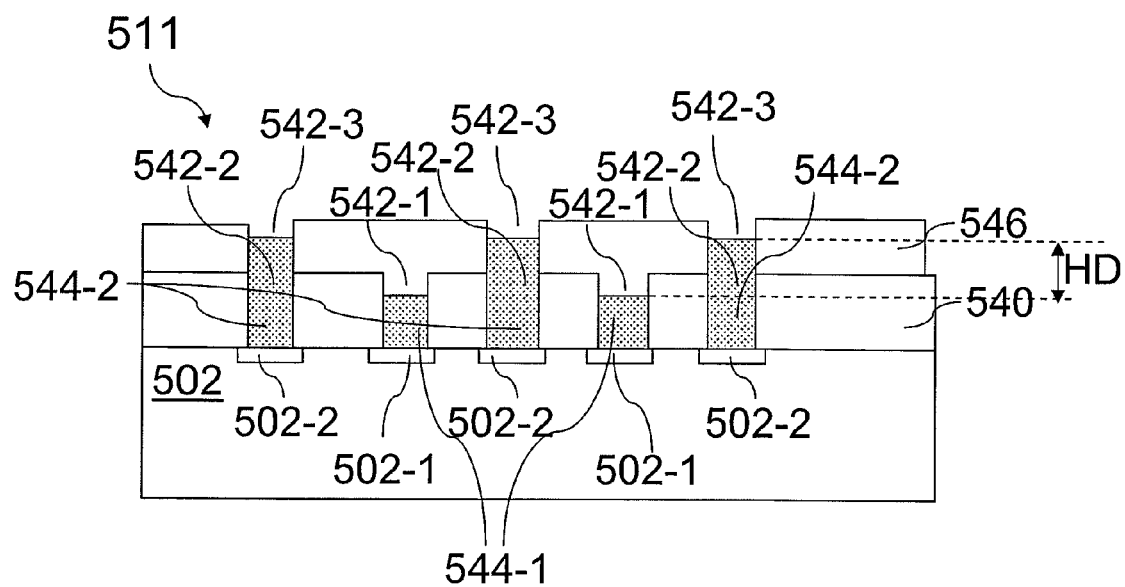

As shown in FIG. 5G in a view 511, the second opening 542-2 may be filled with electrically conductive material and the third opening 542-3 disposed over the second opening 542-2 may be at least partially filled with the electrically conductive material. Filling of the second opening 542-2 and at least partially filling the third opening 542-3 may include a plating process (e.g. electroplating process and/or electroless plating process).

The electrically conductive material may include at least one of a metal and a metal alloy. For example, the electrically conductive material may include, or may consist of, copper, nickel, gold, palladium, titanium, chrome, tungsten, tin, lead or aluminum or a metal alloy or metal stack including one or more of the above mentioned materials.

A result of filling the second opening 542-2 and at least partially filling the third opening 542-3 with electrically conductive material may be extension of the height of the second interconnect 544-2 (e.g. metal post, e.g. copper post). The second interconnect 544-2 may, for example, be identified with the second interconnect 304-2 shown in FIG. 3, and the first interconnect 544-1 may, for example, be identified with the first interconnect 304-1 shown in FIG. 3. For example, the first interconnect 544-1 may be a first electrically conductive pillar formed over the first pad 502-1 of the chip 502, and the second interconnect 544-2 may be a second electrically conductive pillar formed over the second pad 502-2 of the chip 502. The first and second interconnects 544-1 and 544-2 may be used to connect (e.g. electrically connect) the chip 502 to a chip-external element (e.g. a chip interposer) in two planes. For example, the first interconnect 544-1 may be used to connect (e.g. electrically connect) the chip 502 to a chip-external element (e.g. a chip interposer) in a first level (e.g. a first interconnect level), and the second interconnect 544-2 may be used to connect (e.g. electrically connect) the chip 502 to the chip-external element (e.g. chip interposer) in a second level (e.g. a second interconnect level). In the example shown in FIG. 5G, a height difference HD between the first and second interconnects 544-1 and 544-2 may be used to compensate a height difference between the first interconnect level and the second interconnect level of the chip-external element (e.g. chip interposer).

Figure 5H:
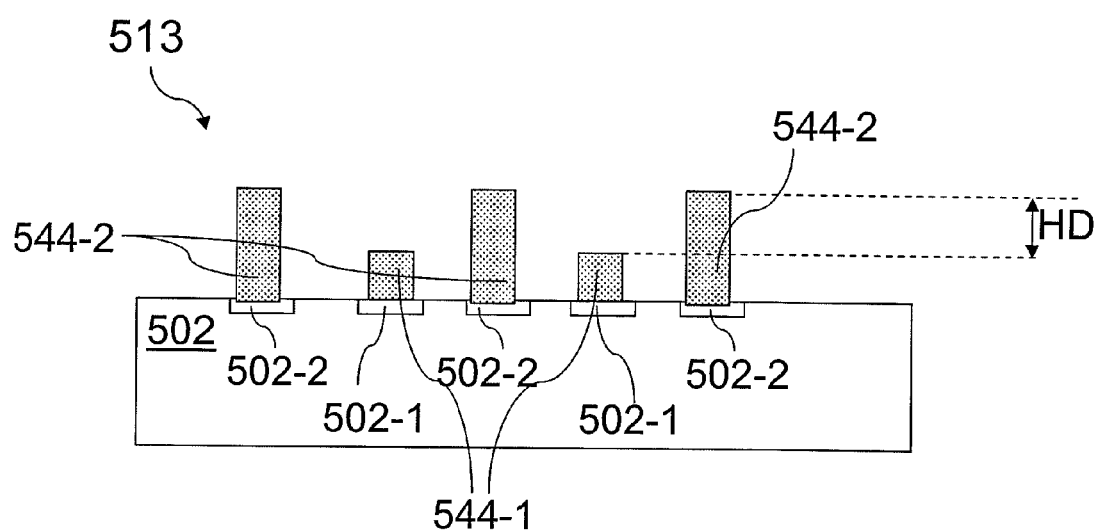

As shown in FIG. 5H in a view 513, the first and second mask layers 540 and 546 may be removed (e.g. by means of a stripping process and/or a dissolution process).

Thereafter, a chip interposer (e.g. a circuit board, e.g. a printed circuit board), e.g. the chip interposer 200 shown in FIG. 2, may be disposed over the chip 502 and the first interconnect 544-1 and the second interconnect 544-2.

As described above, the chip interposer 200 may include the first interconnect level IL-1 including the first pad 202-1 and the second interconnect level IL-2 including the second pad 202-2 which may face in the same direction as the first pad 202-1. The height difference H between the first interconnect level IL-1 and the second interconnect level IL-2 may be at least substantially equal to the height difference HD between the first and second interconnects 544-1 and 544-2.

The chip interposer 200 shown in FIG. 2 may be attached to the chip 502 shown in FIG. 5H. For example, the first pad 202-1 of the chip interposer 200 may be attached to the first interconnect 544-1 (e.g. by means of the electrically conductive interconnect element 307, e.g. solder, e.g. tin solder). In like manner, the second pad 202-2 of the chip interposer 200 may be attached to the second interconnect 544-2 (e.g. by means of the electrically conductive filling element 306, e.g. solder, e.g. tin solder). The second interconnect 544-2 attached to the second pad 202-2 of the chip interposer 200 may be at least partially disposed in the opening 200-O of the chip interposer 200.

The electrically conductive filling element 306 and the electrically conductive interconnect element 307 may, for example, be formed over the first and second interconnects 544-1 and 544-2, respectively, after forming the second interconnect 544-2 (e.g. after the plating process). By way of another example, the electrically conductive filling element 306 and the electrically conductive interconnect element 307 may be formed over the first and second pads 202-1 and 202-2 of the chip interposer 200 prior to disposing the chip interposer 200 over the chip 502 and the first interconnect 544-1 and the second interconnect 544-2. In one or both of the aforementioned examples, forming the electrically conductive filling element 306 and the electrically conductive interconnect element 307 may include a printing process.

As described above, the height difference HD between the first and second interconnects 544-1 and 544-2 may be used to compensate the height difference H between the first interconnect level and the second interconnect level of the chip interposer 200.

In another example, the height of the first and second interconnects 544-1 and 544-2 may be at least substantially equal. In such an example, the electrically conductive filling element 306 disposed in the opening 200-O may compensate for the larger distance between the second pad 502-2 of the chip 502 and the second pad 202-2 of the second interconnect layer IL-2 of the chip interposer 200. In other words, the electrically conductive filling element 306 disposed in the opening 200-O may be used to fill the opening 200-O (e.g. trench, hole, via) leading to the second pad 202-2 in the lower second interconnect level IL-2, thus at least partially (e.g. fully) leveling out the height difference H between the second pad 202-2 and the first pad 202-1 of the chip interposer 200.

Figure 6:
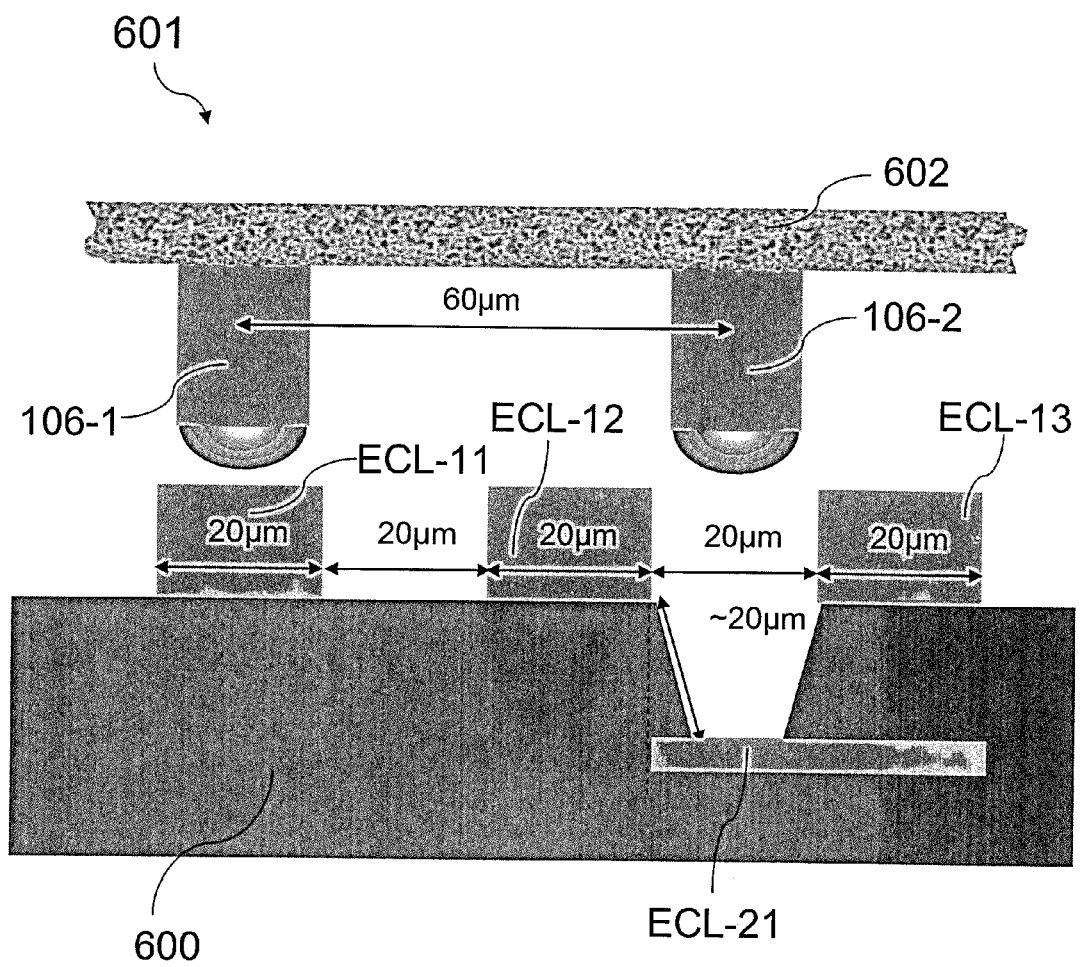
FIG. 6 shows an exemplary semiconductor device where a distance between adjacent interconnects of a chip is about 60 µm and where a line/space requirement of electrically conductive lines provided on a chip interposer is about 20/20 µm.

FIG. 6 shows a semiconductor device 601 where a distance between adjacent interconnects of a chip 602 is about 60 µm and where a line/space requirement of electrically conductive lines ECL-11, ECL-12, ECL-13 provided on a chip interposer 600 is about 20/20 µm.

The semiconductor device 601 shown in FIG. 6 may be similar to the chip package 111 shown in FIG. 1G except that the circuit board 104 shown in FIG. 1G may be replaced by the chip interposer 600.

The chip interposer 600 may be identified with the chip interposer 200 shown in FIG. 2 and FIG. 3.

As shown in FIG. 6, provision of electrically conductive lines ECL-11, ECL-12 and ECL-13 on a surface 600a of the chip interposer 600 and provision of electrically conductive line ECL-21 within a bulk of the chip interposer 600 may allow the chip 602 to be connected (e.g. electrically connected) to the chip interposer 600 in more than one level (e.g. plane). For example, the interconnect 106-1 may be connected to the chip interposer 600 (e.g. to the electrically conductive line ECL-11) on a first plane, and the interconnect 106-2 may be connected to the chip interposer 600 (e.g. to the electrically conductive line ECL-21) on a second plane. Provision of more than one plane for an electrical connection between the chip 102 and the chip interposer 600 may allow at least one routing line to be routed in-between the interconnects 106-1 and 106-2 even at a line/space requirement of 20/20 µm for an interconnect pitch of 60 µm. This may not be possible in the chip package shown in FIG. 1G.

Accordingly, an effect of using the chip interposer 600 may be that more electrically conductive lines may be placed between adjacent interconnects for a particular design rule.

An effect of using the chip interposer 600 may be a relaxation of design rules.

An effect of using the chip interposer 600 may be reduction of a cost of manufacturing a semiconductor device that may use the chip interposer 600.

According to one or more aspects, the present disclosure proposes using a standard interposer (e.g. interposer board) with standard design rules, and contacting a chip (e.g. a flip chip) in at least two different layers of the interposer (e.g. interposer board).

According to various examples presented herein, a chip interposer may be provided. The chip interposer may include: a first interconnect level including a first pad; and a second interconnect level including a second pad, wherein the second pad may face in the same direction as the first pad.

The first and second interconnect levels may be different interconnect levels.

The first interconnect level may include at least one electrically conductive line.

The at least one electrically conductive line may be electrically coupled to the first pad.

The first interconnect level may include a plurality of electrically conductive lines, wherein at least one electrically conductive line of the plurality of electrically conductive lines may be electrically coupled to the first pad.

The first interconnect level may include a metallization layer including at least one electrically conductive line.

The at least one electrically conductive line may run at least substantially parallel to a surface of the first pad.

The second interconnect level may include at least one electrically conductive line.

The at least one electrically conductive line of the second interconnect level may be electrically coupled to the second pad.

The second interconnect level may include a plurality of electrically conductive lines, wherein at least one electrically conductive line of the plurality of electrically conductive lines may be connected to the second pad.

The second interconnect level may include a metallization layer including at least one electrically conductive line.

The at least one electrically conductive line of the second interconnect level may run at least substantially parallel to a surface of the second pad.

At least one of the first and second interconnect levels may be disposed within a bulk of the chip interposer.

The first interconnect level may be disposed at a first surface of the chip interposer and the second interconnect level may be disposed within a bulk of the chip interposer.

The first pad may be disposed at the first surface of the chip interposer and the second pad may be disposed below the first surface of the chip interposer.

The first pad and the second pad may face in the same direction as the first surface of the chip interposer.

The chip interposer may further include a third interconnect level disposed at a second surface of the chip interposer opposite the first surface of the chip interposer, the third interconnect level including a third pad.

The second surface of the chip interposer may face away from the first surface of the chip interposer.

The first surface of the chip interposer may be a front side of the chip interposer and the second surface of the chip interposer may be a back side of the chip interposer.

The third pad may face in an opposite direction than the first pad and the second pad.

The third pad may face in the same direction as the second surface of the chip interposer.

At least one of the first and second pads may be electrically coupled to the third pad.

At least one of the pads may include, or may consist of an electrically conductive material.

The electrically conductive material may include, or may consist of, at least one material selected from a group of materials, the group consisting of: a metal, a metal alloy.

The electrically conductive material may include, or may consist of, at least one material selected from a group of materials, the group consisting of: copper, aluminum, an alloy comprising copper, an alloy comprising aluminum, an alloy comprising copper and aluminum.

The chip interposer may include, or may consist of a laminate.

The laminate may include at least two layers.

The chip interposer may include, or may be, a circuit board.

The circuit board may include, or may be, a printed circuit board.

The chip interposer may include an opening that exposes the second pad.

The opening may include, or may be, a hole or a via or a trench.

The opening may include, or may have, a depth of less than or equal to about 50 μm.

A height difference between the first and second interconnect levels may be less than or equal to about 50 μm.

A lateral distance between the first pad and the second pad may be less than or equal to about 100 μm.

A lateral distance between the first pad and the second pad may be in the range from about 20 μm to about 100 μm.

The second interconnect level may include an electrically conductive line, and the chip interposer may further include a via electrically coupling the first pad to the electrically conductive line.

At least a portion of a surface of the second pad may be exposed.

The first interconnect level may include an electrically conductive line laterally disposed between the first pad and the second pad.

A lateral distance between the electrically conductive line and at least one of the first and second pads may be less than or equal to about 30 μm.

The chip interposer may further include at least one additional interconnect level including at least one additional pad facing in the same direction as the first pad and the second pad.

According to various examples presented herein, a semiconductor device may be provided. The semiconductor device may include: a chip interposer, including a first interconnect level including a first pad; and a second interconnect level including a second pad, wherein the second pad may face in the same direction as the first pad; a chip disposed over the chip interposer, the chip including a first pad and a second pad, wherein the first pad of the chip may be electrically coupled to the first pad of the first interconnect level of the chip interposer and wherein the second pad of the chip may be electrically coupled to the second pad of the second interconnect level of the chip interposer.

At least one of the pads may include an electrically conductive material.

The electrically conductive material may include, or may be, at least one material selected from a group of materials, the group consisting of: a metal, a metal alloy.

The electrically conductive material may include, or may be, at least one material selected from a group of materials, the group consisting of: copper, aluminum, an alloy comprising copper, an alloy comprising aluminum, an alloy comprising copper and aluminum.

A lateral distance between the first pad and the second pad of the chip may be less than or equal to about 100 μm.

A lateral distance between the first pad and the second pad of the chip may be in the range from about 20 μm to about 100 μm.

The lateral distance between the first pad and the second pad of the chip may be, or may correspond to, a pad pitch of the chip.

The semiconductor device may further include first and second interconnects disposed between the chip interposer and the chip, wherein the first interconnect may electrically couple the first pad of the chip to the first pad of the first interconnect level of the chip interposer, and wherein the second interconnect may electrically couple the second pad of the chip to the second pad of the second interconnect level of the chip interposer.

The first interconnect may be disposed between the first pad of the chip and the first pad of the first interconnect level of the chip interposer, and the second interconnect may be disposed between the second pad of the chip and the second pad of the second interconnect level of the chip interposer.

The first interconnect may include, or may be, a first pillar, and the second interconnect may include, or may be, a second pillar.

At least one of the first and second pillars may include, or may consist of, a metal or metal alloy.

The first pillar may have a first height and the second pillar may have a second height, wherein the second height may be greater than the first height.

The chip interposer may include, or may be, a circuit board.

The circuit board may include, or may be, a printed circuit board.

The chip interposer may include an opening adjoining the second pad of the second interconnect level.

The semiconductor device may further include an electrically conductive filling element disposed in the opening and at least partially filling the opening.

The electrically conductive filling element may include, or may be, at least one of the following: solder paste; a solder ball; a metal ball; a solder ball having a metal core.

The semiconductor device may further include a first interconnect disposed between the first pad of the chip and the first pad of the first interconnect level of the chip interposer, and a second interconnect disposed between the second pad of the chip and the second pad of the second interconnect level of the chip interposer and in contact with the electrically conductive filling material.

The first interconnect may include, or may be, a first pillar, and the second interconnect may include, or may be, a second pillar.

The first pillar and the second pillar may have approximately the same height.

The semiconductor device may be configured as a flip chip package.

The chip interposer may further include a third interconnect level disposed at a surface of the chip interposer facing away from the chip, the third interconnect level including a third pad electrically coupled to at least one of the first and second pads of the first and second interconnect levels of the chip interposer.

The chip interposer may further include a ball grid array disposed at a surface of the chip interposer facing away from the chip.

According to various examples presented herein, a method for manufacturing a semiconductor device may be provided. The method may include: providing a chip including at least a first pad and a second pad; forming a first electrically conductive pillar over the first pad; and forming a second electrically conductive pillar over the second pad, wherein the first electrically conductive pillar may include a first height and the second electrically conductive pillar may include a second height that is different from the first height.

The second height may be greater than the first height.

At least one of the first and second electrically conductive pillars may include, or may consist of, a metal or metal alloy.

Forming the first and second electrically conductive pillars may include: forming a first mask layer over the chip including the first and second pads; patterning the first mask layer to form a first opening over the first pad (e.g. exposing the first pad or a seed layer disposed over the first pad) and a second opening over the second pad (e.g. exposing the second pad or a seed layer disposed over the second pad); at least partially filling the first and second openings with electrically conductive material; forming a second mask layer over the patterned first mask layer and the first and second openings; patterning the second mask layer to form a third opening exposing the second opening; filling the second opening and at least partially filling the third opening with electrically conductive material; and removing the first and second mask layers.

The first and second openings may include, or may be, first and second holes.

The third opening may include, or may be, a third hole.

At least one of the first and second mask layers may include, or may consist of, a resist material.

Patterning the first mask layer and/or patterning the second mask layer may include a photolithographic process.

The electrically conductive material may include, or may consist of, a metal or metal alloy.

At least partially filling the first and second openings with electrically conductive material may include a plating process.

The method for manufacturing a semiconductor device may further include: providing a chip interposer including a first interconnect level comprising a first pad, and a second interconnect level including a second pad, wherein the second pad may face in the same direction as the first pad; and attaching the chip to the chip interposer, wherein the first pad of the chip interposer may be attached to the first electrically conductive pillar and the second pad of the chip interposer may be attached to the second electrically conductive pillar.

The first and second pads may be attached to the first and second electrically conductive pillars by means of solder.

The chip interposer may include, or may be, a circuit board, wherein the first interconnect level may be disposed at a surface of the circuit board and the second interconnect level may be disposed within a bulk of the circuit board.

The chip interposer may include an opening disposed over the second pad, and wherein, after attaching the chip to the chip interposer, the second electrically conductive pillar may be at least partially disposed in the opening.

Various examples and aspects described in the context of one of the devices or methods described herein may be analogously valid for the other devices or methods described herein.

While various aspects have been particularly shown and described with reference to these aspects of this disclosure, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A chip interposer, comprising:
   a first interconnect level comprising a first pad and comprising a plurality of first electrically conductive lines, the first pad coupled to one of the first electrically conductive lines; and
   a second interconnect level comprising a second pad and comprising a plurality of second electrically conductive lines, the second pad coupled to one of the second electrically conductive lines not coupled to one of the first electrically conductive lines;
   at least one via electrically coupling one of the first electrically conductive lines that is coupled to the first pad to one of the second electrically conductive lines that is not coupled to the second pad,
   wherein the second pad faces in the same direction as the first pad, and
   wherein the first interconnect level is disposed over the second interconnect level so that the first pad is higher than the second pad and the plurality of first electrically conductive lines are at a same height or higher than the second pad.

2. The chip interposer of claim 1, wherein at least one of the first and second interconnect levels is disposed within a bulk of the chip interposer.

3. The chip interposer of claim 1, wherein the first interconnect level is disposed at a first surface of the chip interposer and the second interconnect level is disposed within a bulk of the chip interposer.

4. The chip interposer of claim 3, further comprising a third interconnect level disposed at a second surface of the chip interposer opposite the first surface of the chip interposer, the third interconnect level comprising a third pad.

5. The chip interposer of claim 4, wherein the third pad faces a direction opposite to a direction to which the first pad and the second pad face.

6. The chip interposer of claim 4, wherein at least one of the first and second pads is electrically coupled to the third pad.

7. The chip interposer of claim 1, wherein the chip interposer comprises a laminate.

8. The chip interposer of claim 1, wherein the chip interposer comprises a circuit board.

9. The chip interposer of claim 1, wherein the chip interposer comprises an opening that exposes the second pad.

10. The chip interposer of claim 1, wherein a lateral distance between the first pad and the second pad is less than or equal to about 100 µm.

11. The chip interposer of claim 1, wherein at least a portion of a surface of the second pad is exposed.

12. The chip interposer of claim 1, wherein a lateral distance between one or more of the first electrically conductive lines and at least one of the first and second pads is less than or equal to about 30 µm.

13. A semiconductor device, comprising:
a chip interposer, comprising:
a first interconnect level comprising a first pad and comprising a plurality of first electrically conductive lines, the first pad coupled to one of the first electrically conductive lines;
a second interconnect level comprising a second pad and comprising a plurality of second electrically conductive lines, the second pad coupled to one of the second electrically conductive lines not coupled to one of the first electrically conductive lines,
at least one via electrically coupling one of the first electrically conductive lines that is coupled to the first pad to one of the second electrically conductive lines that is not coupled to the second pad,
wherein the second pad of the second interconnect level faces in the same direction as the first pad of the first interconnect level and wherein the first interconnect level is disposed over the second interconnect level;
a chip disposed over the chip interposer, the chip comprising a first pad and a second pad, wherein the first pad of the chip is electrically coupled to the first pad of the first interconnect level of the chip interposer and wherein the second pad of the chip is electrically coupled to the second pad of the second interconnect level of the chip interposer.

14. The semiconductor device of claim 13, wherein a lateral distance between the first pad and the second pad of the chip is less than or equal to about 100 µm.

15. The semiconductor device of claim 13, further comprising:
first and second interconnects disposed between the chip interposer and the chip, wherein the first interconnect electrically couples the first pad of the chip to the first pad of the first interconnect level of the chip interposer, and wherein the second interconnect electrically couples the second pad of the chip to the second pad of the second interconnect level of the chip interposer.

16. The semiconductor device of claim 15, wherein the first interconnect comprises a first pillar, and wherein the second interconnect comprises a second pillar.

17. The semiconductor device of claim 16, wherein the first pillar comprises a first height and the second pillar comprises a second height, wherein the second height is greater than the first height.

18. The semiconductor device of claim 13, wherein the chip interposer comprises a circuit board.

19. The semiconductor device of claim 13, wherein the chip interposer comprises an opening adjoining the second pad of the second interconnect level.

20. The semiconductor device of claim 19, further comprising an electrically conductive filling element disposed in the opening and at least partially filling the opening.

21. The semiconductor device of claim 20, wherein the electrically conductive filling element comprises at least one of the following:
solder paste;
a solder ball;
a metal ball;
a solder ball having a metal core.

22. The semiconductor device of claim 20, further comprising a first interconnect disposed between the first pad of the chip and the first pad of the first interconnect level of the chip interposer, and a second interconnect disposed between the second pad of the chip and the second pad of the second interconnect level of the chip interposer and in contact with the electrically conductive filling material.

23. The semiconductor device of claim 13, configured as a flip chip package.

24. A method for manufacturing a semiconductor device, the method comprising:
providing a chip comprising at least a first pad and a second pad;
forming a first electrically conductive pillar over the first pad; and
forming a second electrically conductive pillar over the second pad,
wherein forming the first and second electrically conductive pillars comprises:
forming a first mask layer over the chip including the first and second pads;
patterning the first mask layer to form a first opening over the first pad and a second opening over the second pad;
at least partially filling the first and second openings with electrically conductive material;
forming a second mask layer over the patterned first mask layer and the first and second openings;
patterning the second mask layer to form a third opening exposing the second opening;
filling the second opening and at least partially filling the third opening with electrically conductive material; and
removing the first and second mask layers,
wherein the first electrically conductive pillar comprises a first height and the second electrically conductive pillar comprises a second height that is different from the first height.

25. The method of claim 24, further comprising:
providing a chip interposer comprising a first interconnect level comprising a first pad, and a second interconnect level comprising a second pad, wherein the second pad faces in the same direction as the first pad; and
attaching the chip to the chip interposer, wherein the first pad of the chip interposer is attached to the first electrically conductive pillar and the second pad of the chip interposer is attached to the second electrically conductive pillar.

* * * * *